(12) United States Patent
Otsuka

(10) Patent No.: US 11,233,026 B2
(45) Date of Patent: Jan. 25, 2022

(54) ELECTRONIC COMPONENT

(71) Applicant: Murata Manufacturing Co., Ltd., Nagaokakyo (JP)

(72) Inventor: Shintaro Otsuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/891,239

(22) Filed: Jun. 3, 2020

(65) Prior Publication Data

US 2020/0294947 A1 Sep. 17, 2020

Related U.S. Application Data

(63) Continuation of application No. PCT/JP2018/043346, filed on Nov. 26, 2018.

(30) Foreign Application Priority Data

Dec. 6, 2017 (JP) .............................. JP2017-234597

(51) Int. Cl.
*H01L 23/00* (2006.01)
*H03H 9/05* (2006.01)

(52) U.S. Cl.
CPC ............ *H01L 24/13* (2013.01); *H01L 23/564* (2013.01); *H01L 24/05* (2013.01); *H03H 9/059* (2013.01); *H01L 2224/0212* (2013.01); *H01L 2224/0401* (2013.01); *H01L 2224/11849* (2013.01); *H01L 2224/16501* (2013.01)

(58) Field of Classification Search
CPC ...................................................... H01L 24/13
See application file for complete search history.

(56) References Cited

U.S. PATENT DOCUMENTS

2008/0266023 A1* 10/2008 Tanaka ................. H03H 9/0576
333/133
2018/0013404 A1 1/2018 Kawasaki et al.

FOREIGN PATENT DOCUMENTS

| JP | 2008-016514 A | 1/2008 |
| JP | 2010-251631 A | 11/2010 |
| JP | 2010-251687 A | 11/2010 |
| JP | 2016-086008 A | 5/2016 |

(Continued)

OTHER PUBLICATIONS

Official Communication issued in International Patent Application No. PCT/JP2018/043346, dated Jan. 15, 2019.

*Primary Examiner* — William A Harriston
(74) *Attorney, Agent, or Firm* — Keating & Bennett, LLP

(57) ABSTRACT

A electronic component includes a connection electrode on a wiring layer. An electrically conductive layer is connected to the wiring layer via the connection electrode. A protective film covers a cover portion and the electrically conductive layer. A solder bump is electrically connected to the electrically conductive layer via an opening. An alloy layer is between the solder bump and the electrically conductive layer in a thickness direction to join the solder bump to the electrically conductive layer and differs in composition and/or elements from the solder bump. The connection electrode does not overlap the solder bump. The surface of the electrically conductive layer that is located on a protective film side is in contact with the protective film between the alloy layer and an edge of the electrically conductive layer that is located on a connection electrode side.

17 Claims, 16 Drawing Sheets

(56) References Cited

FOREIGN PATENT DOCUMENTS

| JP | 2017-050728 A | 3/2017 |
|---|---|---|
| WO | 2007083432 A1 | 7/2007 |
| WO | 2016/208287 A1 | 12/2016 |

\* cited by examiner

ELECTRONIC COMPONENT

CROSS REFERENCE TO RELATED APPLICATIONS

This application claims the benefit of priority to Japanese Patent Application No. 2017-234597 filed on Dec. 6, 2017 and is a Continuation Application of PCT Application No. PCT/JP2018/043346 filed on Nov. 26, 2018. The entire contents of each application are hereby incorporated herein by reference.

BACKGROUND OF THE INVENTION

1. Field of the Invention

The present invention relates generally to electronic components and, more particularly, to an electronic component including solder bumps.

2. Description of the Related Art

One known conventional electronic component is a semiconductor device including solder bump electrodes (see, for example, Japanese Unexamined Patent Application Publication No. 2008-016514).

The semiconductor device described in Japanese Unexamined Patent Application Publication No. 2008-016514 includes a semiconductor element, bonding pad portions, a passivation film, first openings, a UBM (Under Bump Metal), solder bump electrodes, and a resin film. The semiconductor element is, for example, a CMOS (Complementary Metal Oxide Semiconductor) device formed on a principal surface of a semiconductor substrate. The passivation film covers the bonding pad portions. Each first opening is formed in the passivation film and allows the upper surface of a corresponding bonding pad portion to be exposed. The UBM is connected to the bonding pad portion via the first opening. The UBM is a layered film including a first metal film and a second metal film. Each solder bump electrode is connected to the upper and side surfaces of the second metal film.

In a semiconductor device production method described in Japanese Unexamined Patent Application Publication No. 2008-016514, a metal seed layer is formed before the resin film and the solder bump electrodes are formed. The metal seed layer is formed selectively on the upper and side surfaces of the second metal layer forming the upper layer of the UBM. During reflow processing performed in the course of forming the solder bump electrodes, a solder pattern (e.g., a solder paste used for a printing method, a solder layer used for a plating method, or solder balls used for a ball method) reacts with the metal seed layer formed on the upper surface of the second metal film and also reacts with the metal seed layer formed on the side surfaces of the second metal film that area covered with the resin film. Therefore, the solder bump electrodes are connected to the upper and side surfaces of the second metal film forming the upper layer of the UBM.

In the semiconductor device (electronic component) including the solder bump electrodes described in Japanese Unexamined Patent Application Publication No. 2008-016514, it is feared that, for example, moisture in the air enters the semiconductor device through gaps between the resin film (protective film) and portions of the solder bump electrodes that are connected to the UBM, reaches the semiconductor element (functional element portion), and affects the characteristics of the electronic component.

SUMMARY OF THE INVENTION

Preferred embodiments of the present invention provide electronic components that each have improved moisture resistance.

An Electronic component according to a preferred embodiment of the present invention includes a substrate, a functional element portion, a wiring layer, a cover portion, a connection electrode, an electrically conductive layer, a protective film, a solder bump, and an alloy layer. The functional element portion is on a front surface side of the substrate. The wiring layer is on the front surface side of the substrate and is electrically connected to the functional element portion. The cover portion is on the front surface side of the substrate and protects the functional element portion. The connection electrode is on the wiring layer and extends in a thickness direction of the substrate. The electrically conductive layer is on the cover portion and the connection electrode and electrically connected to the wiring layer via the connection electrode. The protective film covers the cover portion and the electrically conductive layer and includes an opening in a projection region of a portion of the electrically conductive layer in the thickness direction. The solder bump is electrically connected to the electrically conductive layer via the opening. The alloy layer is provided between the solder bump and the electrically conductive layer in the thickness direction to join the solder bump to the electrically conductive layer and differs in at least one of composition and a combination of elements from the solder bump. The electronic component includes a plurality of sets of the wiring layer, the connection electrode, the electrically conductive layer, the solder bump, and the alloy layer. The protective film includes a plurality of the openings corresponding to the plurality of sets. In at least one set of the plurality of sets, the connection electrode is structured such that at least a portion thereof does not overlap the solder bump in a plan view in the thickness direction. A surface of the electrically conductive layer that is located on a protective film side is in contact with the protective film in a region between the alloy layer and an edge of the electrically conductive layer that is located on a connection electrode side in a plan view in the thickness direction.

An electronic component according to a preferred embodiment of the present invention includes a substrate, a functional element portion, a wiring layer, a cover portion, a connection electrode, an electrically conductive layer, a protective film, a solder bump, and an alloy layer. The functional element portion is on a front surface side of the substrate. The wiring layer is on the front surface side of the substrate and electrically connected to the functional element portion. The cover portion is on the front surface side of the substrate and protects the functional element portion. The connection electrode is on the wiring layer and extends in a thickness direction of the substrate. The electrically conductive layer is on the connection electrode and a back surface of the substrate that is opposite to the front surface thereof and electrically connected to the wiring layer via the connection electrode. The protective film covers the back surface of the substrate and the electrically conductive layer and includes an opening in a projection region of a portion of the electrically conductive layer in the thickness direction. The solder bump is electrically connected to the electrically conductive layer via the opening. The alloy layer is provided between the solder bump and the electrically conductive layer in the thickness direction to join the solder bump to the electrically conductive layer and differs in at least one of composition and a combination of elements from the solder bump. The electronic component includes a plurality of sets of the wiring layer, the connection electrode, the electrically conductive layer, the solder bump, and the alloy layer. The protective film includes a plurality of the openings corresponding to the plurality of sets. In at least one set of the plurality of sets, the connection electrode is structured such that at least a portion thereof does not overlap the solder bump in a plan view in the thickness direction. A surface of the electrically conductive layer that is located on a protective film side is in contact with the protective film in a region between the alloy layer and an edge of the electrically conductive layer that is located on a connection electrode side in a plan view in the thickness direction.

In electronic components according to preferred embodiments of the present invention, moisture resistance thereof is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
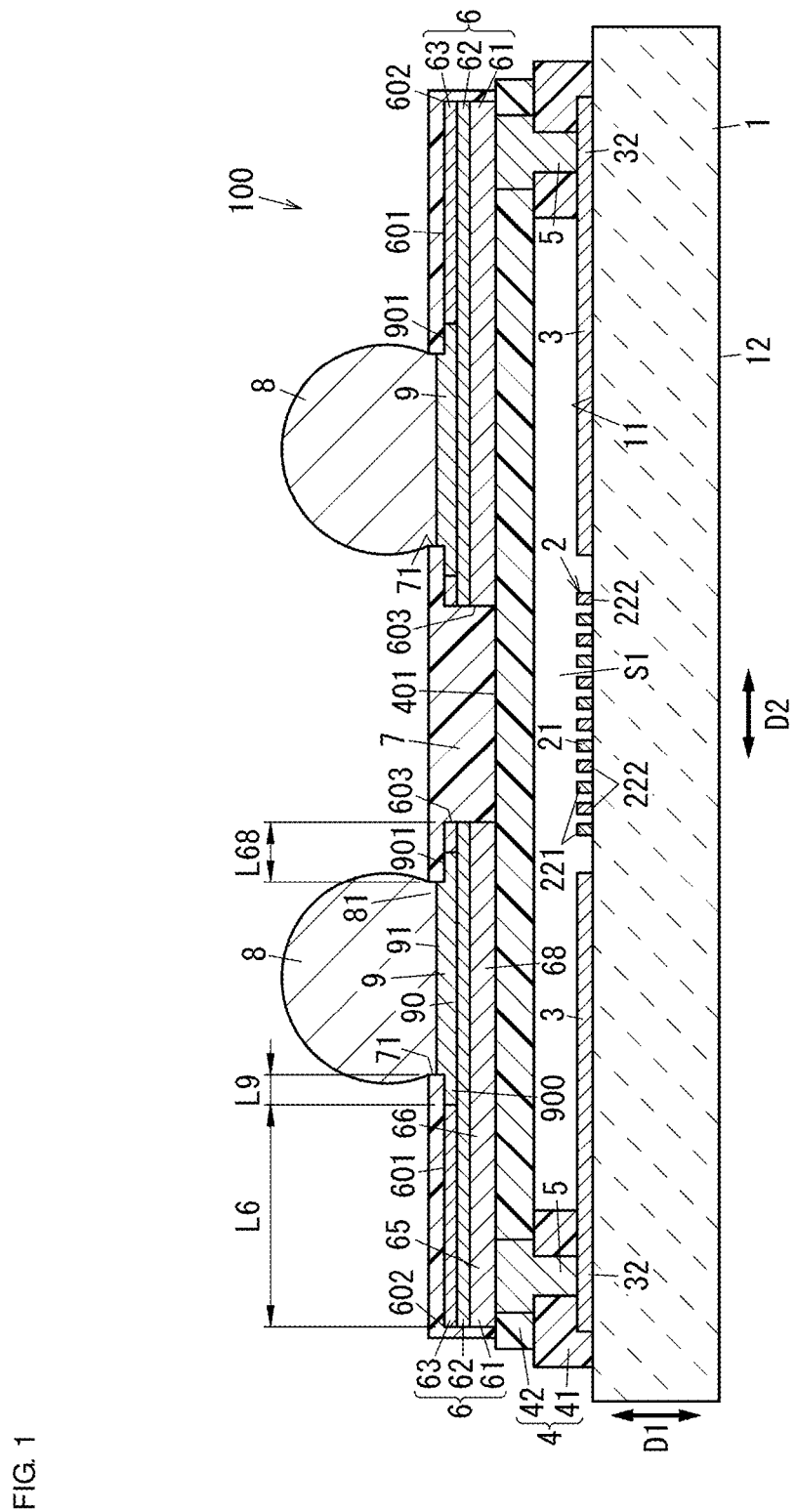
FIG. 1 is a cross-sectional view of an electronic component according to preferred embodiment 1 of the present invention.

Electronic components according to preferred embodiments of the present invention will be described in detail with reference to the drawings.

FIGS. 1 to 16 referred to in the preferred embodiments below etc. are schematic illustrations, and the ratios of sizes and thicknesses of elements and portions in the drawings do not always reflect actual dimensional ratios.

Preferred Embodiment 1

(1) Overall Structure of Electronic Component

An electronic component 100 according to preferred embodiment 1 of the present invention will be described with reference to the drawings.

Figure 2:
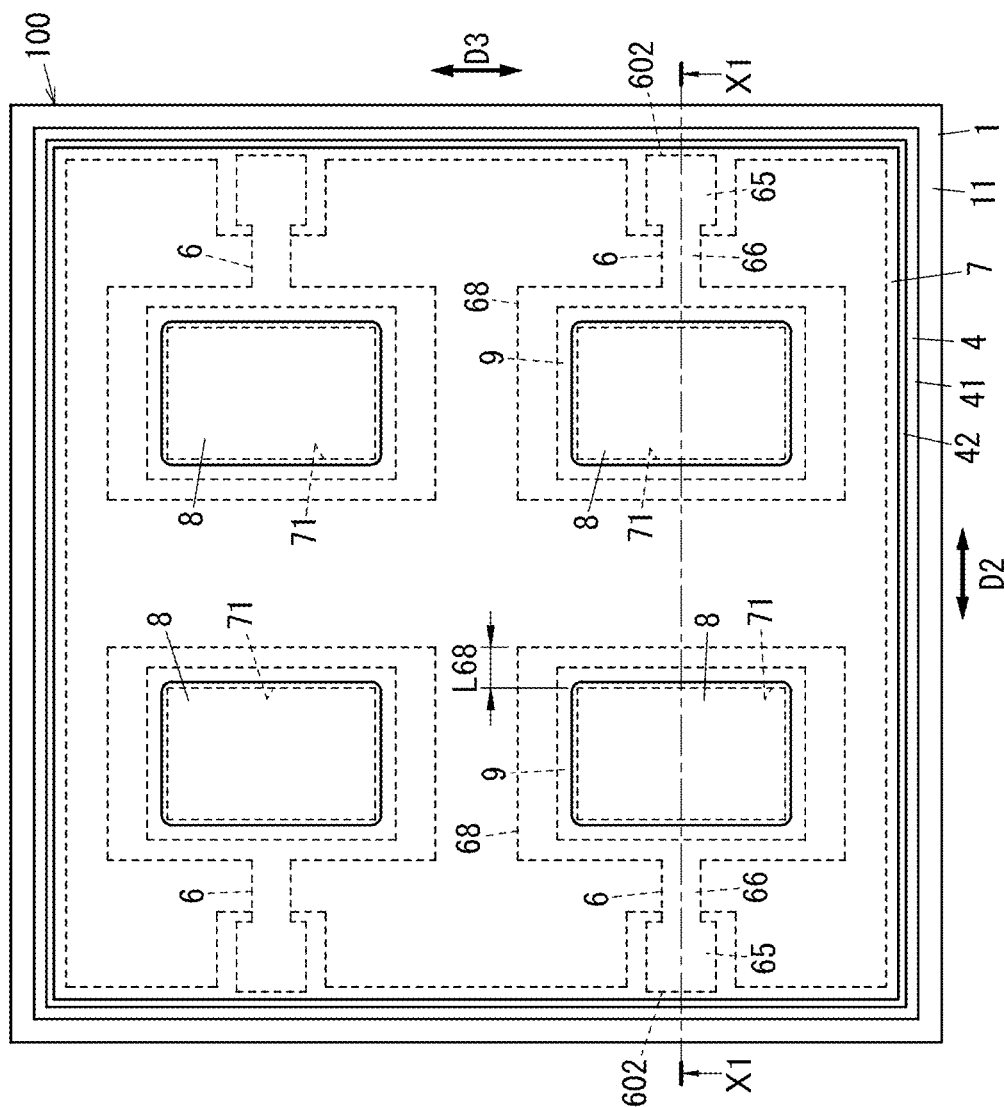
FIG. 2 is a plan view of the electronic component.

As shown in FIGS. 1 and 2, the electronic component 100 according to preferred embodiment 1 preferably includes a substrate 1, a plurality of (e.g., two) functional element portions 2, a plurality of (e.g., four) wiring layers 3, a cover portion 4, a plurality of (4 in the example shown) connection electrodes 5, a plurality of (4 in the example shown) electrically conductive layers 6, a protective film 7, a plurality of (4 in the example shown) solder bumps 8, and a plurality of (4 in the example shown) alloy layers 9. FIG. 1 is a cross-sectional view taken along line X1-X1 in FIG. 2. The plurality of solder bumps 8 are used when the electronic component 100 is mounted on a mounting substrate. When the electronic component 100 is mounted on the mounting substrate, the plurality of solder bumps 8 are electrically and mechanically connected to the mounting substrate. The mounting substrate is preferably, for example, a printed wiring board or a LTCC (Low Temperature Co-fired Ceramic).

The substrate 1 includes a front surface (first principal surface) 11 and a back surface (second principal surface) 12 that are opposite to each other in a thickness direction D1 of the substrate 1. The functional element portions 2 are on the front surface 11 side of the substrate 1. The plurality of wiring layers 3 are on the front surface 11 side of the substrate 1 and electrically connected to the functional element portions 2. In the electronic component 100 according to preferred embodiment 1, two wiring layers 3 are electrically connected to each of the two functional element portions 2.

The cover portion 4 is on the front surface 11 side of the substrate 1 and protects the functional element portions 2. In the electronic component 100 according to preferred embodiment 1, the plurality of connection electrodes 5 correspond one-to-one to the plurality of wiring layers 3. Each of the plurality of connection electrodes 5 preferably is on a corresponding one of the wiring layers 3 and extends in the thickness direction D1 of the substrate 1.

In the electronic component 100 according to preferred embodiment 1, the plurality of electrically conductive layers 6 correspond one-to-one to the plurality of connection electrodes 5. The electrically conductive layers 6 are on the cover portion 4 and the connection electrodes 5 and electrically connected to the wiring layers 3 via the connection electrodes 5.

The protective film 7 covers the cover portion 4 and the plurality of electrically conductive layers 6. The protective film 7 includes a plurality of openings 71. The plurality of openings 71 correspond one-to-one to the plurality of electrically conductive layers 6. Each of the plurality of openings 71 in the protective film 7 is preferably provided in a projection region of a portion of a corresponding one of the plurality of electrically conductive layers 6 in the thickness direction D1 of the substrate 1.

The plurality of solder bumps 8 correspond one-to-one to the plurality of electrically conductive layers 6. The plurality of solder bumps 8 are surrounded by the protective film 7. Each of the plurality of solder bumps 8 is electrically connected to a corresponding one of the electrically conductive layers 6 via a corresponding one of the openings 71. Each alloy layer 9 is provided between a corresponding solder bump 8 and a corresponding electrically conductive layer 6 in the thickness direction D1 of the substrate 1 to join the solder bump 8 to the electrically conductive layer 6. The alloy layers 9 preferably differ in at least one of composition and a combination of elements from the solder bumps 8. In the electronic component 100 according to preferred embodiment 1, both the composition and the combination of the alloy layers 9 preferably differ from those of the solder bumps 8.

The electronic component 100 according to preferred embodiment 1 is preferably an acoustic wave device that uses acoustic waves. Each of the functional element portions 2 includes an IDT (Interdigital Transducer) electrode 21. The electronic component 100 according to preferred embodiment 1 includes a space S1 surrounded by the substrate 1 and the cover portion 4. The IDT electrodes 21 are in the space S1.

(2) Elements of Electronic Component

Next, the elements of the electronic component 100 will be described with reference to the drawings.

The shape of the substrate 1 in a plan view (the outer circumferential shape of the substrate 1 when viewed in the thickness direction D1) is preferably square or substantially square, but is not limited to the square shape and may be rectangular or substantially rectangular, or any other desirable shape. In the electronic component 100 according to preferred embodiment 1, the substrate 1 has piezoelectricity at least in regions in which the IDT electrodes 21 are provided. The substrate 1 is a piezoelectric substrate. The piezoelectric substrate is preferably a $LiNbO_3$ substrate, for example, but this is not a specific requirement as the substrate 1 may be, for example, a $LiTaO_3$ substrate, a ZnO substrate, an AlN substrate, etc. In the electronic component 100 according to preferred embodiment 1, the substrate 1 has electrical insulating properties at least in the regions in which the IDT electrodes 21 are provided.

The functional element portions 2 are on the front surface 11 side of the substrate 1. More particularly, the functional element portions 2 include the respective IDT electrodes on the front surface 11 of the substrate 1. The IDT electrodes are supported on the substrate 1. Each IDT electrode is a functional electrode that converts an acoustic wave propagating through the substrate 1 to an electric signal or converts an electric signal to an acoustic wave. Each IDT electrode 21 can preferably be made of a suitable metal material such as, for example, Al, Cu, Pt, Au, Ag, Ti, Ni, Cr, Mo, W, or an alloy composed mainly of any of these metals.

Each IDT electrode 21 may have a structure formed by stacking a plurality of metal films formed of any of these metals or an alloy thereof.

Each of the IDT electrodes 21 preferably includes a first busbar, a second busbar, a plurality of first electrode fingers 221, and a plurality of second electrode fingers 222.

The first and second busbars each have an elongated shape having a longitudinal direction extending in a second direction D2 of the substrate 1 orthogonal or substantially orthogonal to its thickness direction D1 (first direction). In each IDT electrode 21, the first and second busbars oppose each other in a third direction D3 (see FIG. 2) orthogonal or substantially orthogonal to both the first direction (the thickness direction D1 of the substrate 1) and the second direction D2.

The plurality of first electrode fingers 221 are connected to the first busbar and extend toward the second busbar. The plurality of first electrode fingers 221 extend from the first busbar in a direction (the third direction D3) orthogonal or substantially orthogonal to the longitudinal direction of the first busbar (the second direction D2). The forward ends of the plurality of first electrode fingers 221 are spaced apart from the second busbar. For example, the plurality of first electrode fingers 221 preferably have the same or substantially the same length and the same or substantially the same width.

The plurality of second electrode fingers 222 are connected to the second busbar and extend toward the first busbar. The plurality of second electrode fingers 222 extend from the second busbar in a direction (the third direction D3) orthogonal or substantially orthogonal to the longitudinal direction (the second direction D2) of the second busbar. The forward ends of the plurality of second electrode fingers 222 are spaced apart from the first busbar. For example, the plurality of second electrode fingers 222 preferably have the same or substantially the same length and the same or substantially the same width.

In each of the IDT electrodes 21, the plurality of first electrode fingers 221 and the plurality of second electrode fingers 222 are arranged alternately in the second direction D2 so as to be spaced from each other. Therefore, each first electrode finger 221 and a corresponding second electrode finger 222 adjacent thereto in the second direction D2 are spaced apart from each other. The period of the electrode fingers of each IDT electrode 21 is defined, for example, as the distance between center lines of two adjacent first electrode fingers 221 or the distance between center lines of two adjacent second electrode fingers 222 and is twice the distance between one side edge of a first electrode finger 221 and a corresponding side edge of an adjacent second electrode finger 222.

The wiring layers 3 are on the front surface 11 side of the substrate 1. More particularly, the wiring layers 3 are on the front surface 11 of the substrate 1. The wiring layers 3 electrically connect the connection electrodes 5 to the functional element portions 2. The wiring layers 3 can preferably be made of an appropriate metal material such as, for example, Al, Cu, Pt, Au, Ag, Ti, Ni, Cr, Mo, W, or an alloy composed mainly of any of these metals. The wiring layers 3 may have a structure defined by stacking a plurality of metal films made of any of these metals or an alloy thereof.

The wiring layers 3 overlap a portion of the functional element portions 2 and a portion of the substrate 1 in the thickness direction D1 of the substrate 1. Each of the wiring layers 3 includes a first connection portion and a second connection portion 32. The first connection portion is connected to a corresponding functional element portion 2.

More particularly, the first connection portion is connected to the first busbar or the second busbar of a corresponding IDT electrode 21. The second connection portion 32 is connected to a corresponding connection electrode 5. The second connection portion 32 is interposed between the substrate 1 and the cover portion 4. The second connection portion 32 is located inward of the outer circumference of the cover portion 4.

The cover portion 4 is on the front surface 11 side of the substrate 1 and protects the functional element portions 2. More particularly, the cover portion 4 is on the front surface 11 side of the substrate 1 side so as to cover the functional element portions 2. The cover portion 4 covers the functional element portions 2 so as not to be in contact with the IDT electrodes 21 of the functional element portions 2. Specifically, the cover portion 4 is not in contact with the IDT electrodes 21 of the functional element portions 2. The cover portion 4 protects the functional element portions 2 from an external impact, moisture, etc.

The cover portion 4 preferably includes a cover layer 42 and a spacer layer 41. The cover layer 42 opposes the substrate 1 in the thickness direction D1 of the substrate 1 and is spaced apart from the functional element portions 2. The spacer layer 41 has a frame shape. The spacer layer 41 is interposed between the substrate 1 and the cover layer 42. The spacer layer 41 surrounds the functional element portions 2 in a plan view in the thickness direction D1. In the electronic component 100, the atmosphere in the space S1 surrounded by the cover layer 42, the spacer layer 41, and the substrate 1 is preferably, for example, air, but this is not a limitation. The atmosphere may be, for example, an inert gas atmosphere. The inert gas is preferably, for example, $N_2$ gas.

The cover layer 42 has a flat plate shape. The shape of the cover layer 42 in a plan view (the outer circumferential shape when viewed in the thickness direction D1 of the substrate 1) is preferably a square or substantially square shape but is not limited to the square or substantially square shape and may be, for example, a rectangular or substantially rectangular shape, or any other desirable shape. The outer circumferential shape of the cover layer 42 is smaller than the outer circumferential shape of the substrate 1. The outer circumferential shape of the cover layer 42 is smaller than the outer circumferential shape of the spacer layer 41 and larger than the inner circumferential shape of the spacer layer 41. The cover layer 42 is on the spacer layer 41. The cover layer 42 is spaced apart from the IDT electrodes 21 in the thickness direction D1. The cover layer 42 has electrical insulating properties. The material of the cover layer 42 is preferably, for example, a synthetic resin such as an epoxy resin, a polyimide resin, or an acrylic resin.

The spacer layer 41 is provided along the outer circumference of the substrate 1 in a plan view. The shape of the spacer layer 41 in a plan view is a frame shape. The outer circumferential shape of the spacer layer 41 is preferably, for example, a square or substantially square shape. The inner circumferential shape of the spacer layer 41 is preferably, for example, a square or substantially square shape. The outer circumferential shape of the spacer layer 41 is smaller than the outer circumferential shape of the substrate 1. The spacer layer 41 covers a portion of the second connection portions 32 of the wiring layers 3. Specifically, the spacer layer 41 includes a first portion provided directly on the front surface 11 of the substrate 1 and a second portion provided indirectly on the front surface 11 of the substrate 1 with the second connection portions 32 interposed therebetween. The first portion is provided along the entire or substantially the entire outer circumference of the substrate 1.

The spacer layer 41 has electrical insulating properties. The material of the spacer layer 41 is preferably, for example, a synthetic resin such as an epoxy resin, a polyimide resin, or an acrylic resin. In the cover portion 4, the cover layer 42 is bonded directly to the spacer layer 41. Preferably, the main component of the material of the spacer layer 41 is the same as the main component of the material of the cover layer 42. More preferably, the material of the spacer layer 41 is the same as the material of the cover layer 42.

The thickness of the spacer layer 41 is larger than the sum of the thickness of the IDT electrodes 21 and the thickness of the wiring layers 3.

The electronic component 100 preferably includes a plurality of sets of the wiring layer 3, the connection electrode 5, the electrically conductive layer 6, the solder bump 8, and the alloy layer 9. In each of the plurality of sets, the connection electrode 5 is a through electrode passing through the cover portion 4 in the thickness direction D1 of the substrate 1. More particularly, the connection electrode 5 passes through the spacer layer 41 and the cover layer 42. The connection electrode 5 is provided on the second connection portion 32 of the wiring layers 3 and electrically connected to the second connection portion 32.

The connection electrode 5 can preferably be made of an appropriate metal material such as, for example, Cu, Ni, or an alloy composed mainly of any of these metals.

The connection electrode 5 is provided such that at least a portion thereof does not overlap the solder bump 8 in a plan view in the thickness direction D1 of the substrate 1. In the electronic component 100 according to preferred embodiment 1, the connection electrode 5 is structured such that the entire or substantially the entire connection electrode 5 does not overlap the solder bump 8 in a plan view in the thickness direction D1. Specifically, the connection electrode 5 is spaced apart from the solder bump 8 in a plan view in the thickness direction D1.

The electrically conductive layers 6 are on the cover portion 4 and on the connection electrodes 5. The plurality of electrically conductive layers 6 are preferably spaced apart from each other on the cover portion 4. Therefore, the plurality of electrically conductive layers 6 are electrically insulated from each other. In each of the plurality of sets, the electrically conductive layer 6 is electrically connected to the wiring layer 3 via the connection electrode 5. The electrically conductive layer 6 is a rewiring layer and includes a first connection portion 65 connected to the connection electrode 5, a second connection portion 68 connected to the solder bump 8 with the alloy layer 9 interposed therebetween, and an intermediate portion 66 between the first connection portion 65 and the second connection portion 68. A portion of the first connection portion 65 overlaps the connection electrode 5 in the thickness direction D1 of the substrate 1. The first connection portion 65 is in contact with an end surface of the connection electrode 5 that is opposite to the wiring layer 3 side. A portion of the second connection portion 68 overlaps the alloy layer 9 and the solder bump 8 in the thickness direction D1 of the substrate 1. The shape of the first connection portion 65 in a plan view (its outer circumferential shape when viewed in the thickness direction D1 of the substrate 1) is a square shape, but is not limited to the square shape, and may be, for example, a rectangular shape, a circular shape, etc. The shape of the second connection portion 68 in a plan view (its outer circumferential shape when viewed in the thickness direction D1 of the substrate 1) is preferably a rectangular or substantially rectangular shape, but is not limited to the rectangular or substantially rectangular shape, and may be, for example, a square shape, a circular shape, etc.

The electrically conductive layer 6 preferably includes a first layer 61, a second layer 62, and a third layer 63 that are stacked from the side close to the cover portion 4. From the viewpoint of reducing the electric resistance of the electrically conductive layer 6, the first layer 61 is preferably, for example, a Cu layer. From the viewpoint of preventing diffusion of the solder (e.g., SnAgCu) in the solder bump 8, the second layer 62 is preferably, for example, a Ni layer. Specifically, it is preferable that the second layer 62 defines and functions as a barrier metal layer. Moreover, the second layer 62 preferably defines and functions as an under bump metal. The third layer 63 is preferably, for example, an Au layer. The third layer 63 surrounds the entire or substantially the entire circumference of the alloy layer 9.

The thickness of the electrically conductive layer 6 is preferably, for example, about 13.1 μm. The thickness of the first layer 61, the thickness of the second layer 62, and the thickness of the third layer 63 are, for example, preferably about 10 μm, about 3 μm, and about 0.1 μm, respectively. These thicknesses of the first layer 61, the second layer 62, and the third layer 63 are examples, and no particular limitation is imposed on the thicknesses.

In each of the plurality of sets, the electrically conductive layer 6 is in contact with the protective film 7 in a region between the alloy layer 9 and an edge 602 on the connection electrode 5 side in a plan view in the thickness direction D1. In this region, the electrically conductive layer 6 and the protective film 7 are in close contact with each other.

Moreover, the electrically conductive layer 6 is in contact with the protective film 7 in a region between the outer circumference of the second connection portion 68 and the alloy layer 9 in a plan view in the thickness direction D1. In this region, the electrically conductive layer 6 and the protective film 7 are in close contact with each other.

The protective film 7 covers a surface 401 of the cover portion 4 that is opposite to the substrate 1 side, surfaces (first principal surfaces) 601 of the plurality of electrically conductive layers 6 that are on the protective film 7 side, and their outer circumferential surfaces 603. Moreover, the protective film 7 covers surfaces 901 of the plurality of alloy layers 9 that are on the protective film 7 side. The outer circumferential shape of the protective film 7 is smaller than the outer circumferential shape of the cover layer 42. The protective film 7 protects the plurality of electrically conductive layers 6 from an external impact, moisture, etc., for example.

The protective film 7 includes a plurality of openings 71 that correspond to the plurality of sets. Each of the plurality of openings 71 of the protective film 7 is provided in a projection region of a portion of the second connection portion 68 of a corresponding one of the plurality of electrically conductive layers 6. The opening shape of the openings 71 is preferably, for example, a rectangular or substantially rectangular shape, but this is not a specific requirement. The opening shape may be, for example, a square shape, a circular shape, etc. In a plan view in the thickness direction D1 of the substrate 1, the openings 71 are smaller than the second connection portions 68 of the electrically conductive layers 6. In a plan view in the thickness direction D1 of the substrate 1, the openings 71 are smaller than the alloy layers 9.

The protective film 7 has electrical insulating properties. The protective film 7 is preferably made of a material having lower wettability with respect to the solder (e.g., SnAgCu) in the solder bumps 8 than the electrically conductive layers 6. The wettability of the protective film 7 is lower than the wettability of the third layers 63 of the electrically conductive layers 6. The protective film 7 is preferably, for example, a polyimide resin, but is not limited thereto, and may be, for example, an epoxy resin, an acrylic resin, etc.

The material of the solder bumps 8 is preferably lead-free solder, for example. More particularly, the material of the solder bumps 8 is preferably, for example, SnAgCu. The material of the solder bumps 8 is not limited to SnAgCu and may be, for example, SnAg.

In each of the plurality of sets, the solder bump 8 is electrically connected to the electrically conductive layer 6 via the opening 71. The solder bump 8 is joined to the electrically conductive layer 6 with the alloy layer 9 interposed therebetween. An end portion 81 of the solder bump 8 that is on the electrically conductive layer 6 side in the thickness direction D1 of the substrate 1 is in the opening 71. The outer circumferential surface of the end portion 81 of the solder bumps 8 is in contact with the inner circumferential surface of the opening 71 of the protective film 7.

In a plan view in the thickness direction D1 of the substrate 1, the solder bump 8 overlaps the entire or substantially the entire opening 71 of the protective film 7. In other words, the solder bump 8 covers the opening 71 in a plan view in the thickness direction D1 of the substrate 1.

The plurality of solder bumps 8 are arranged so as to be spaced apart from each other in a direction along the outer circumference of the protective film 7. The plurality of solder bumps 8 are provided near the respective four corners of the protective film 7 in a plan view in the thickness direction D1 of the substrate 1.

In each of the plurality of sets in the electronic component 100, the electrically conductive layer 6 and the solder bump 8 are joined with the alloy layer 9 interposed therebetween. The alloy layer 9 preferably includes, for example, Sn and Au as elements. Both the composition and a combination of elements of the alloy layer 9 differ from those of the solder bump 8. The alloy layer 9 is formed by, for example, the reaction between the solder melted during reflow treatment (hereinafter referred to as "molten solder") and an electrically conductive layer 60 (see FIGS. 3 and 4) in the course of production of the electronic component 100. More particularly, the alloy layer 9 is formed by the reaction between the molten solder and a third layer 630 (Au seed layer) of the electrically conductive layer 60 formed before the reflow treatment.

Figure 3:
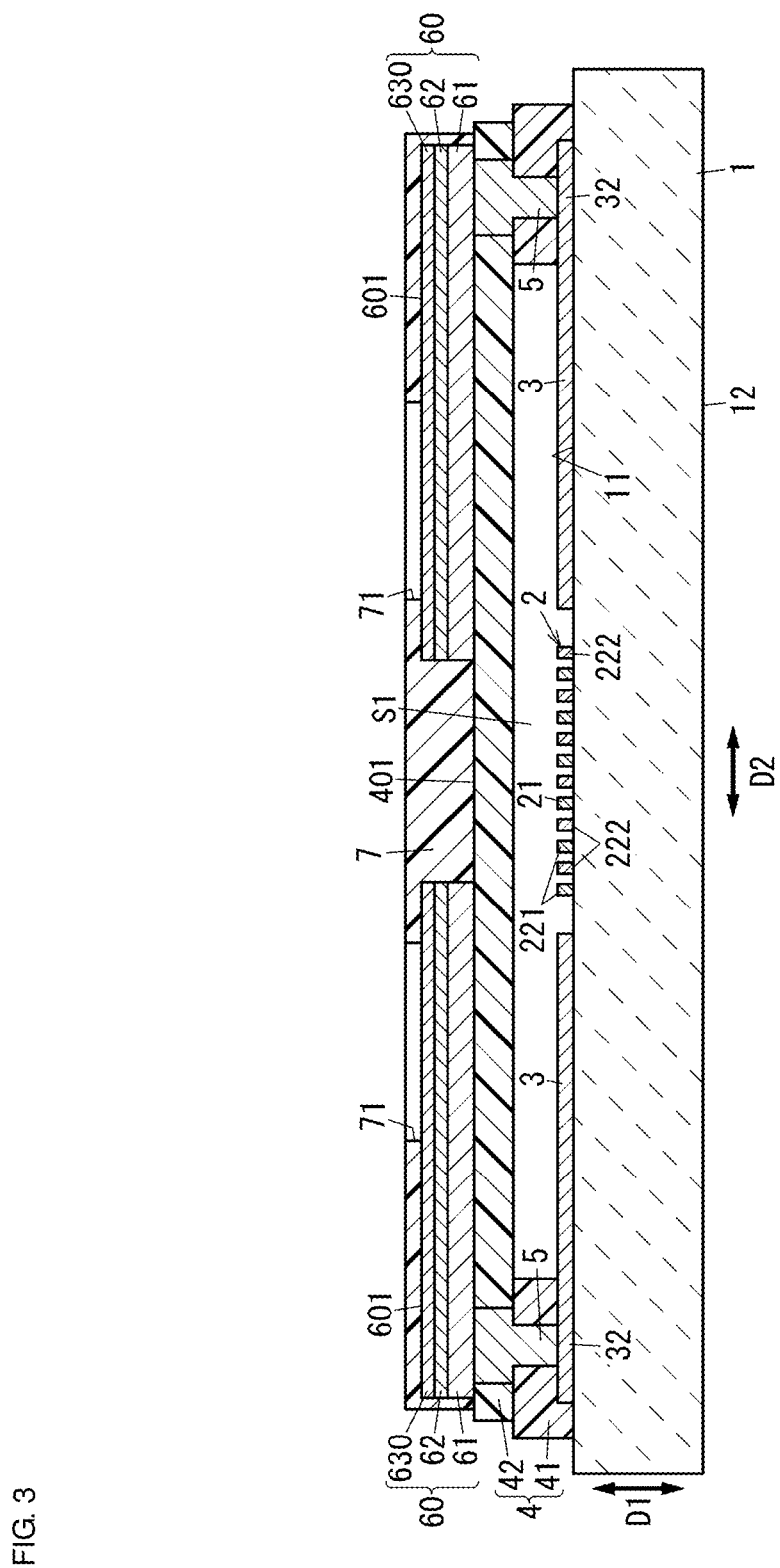
FIG. 3 is a cross-sectional view illustrating a preferred embodiment of a method for producing the electronic component.
Figure 4:
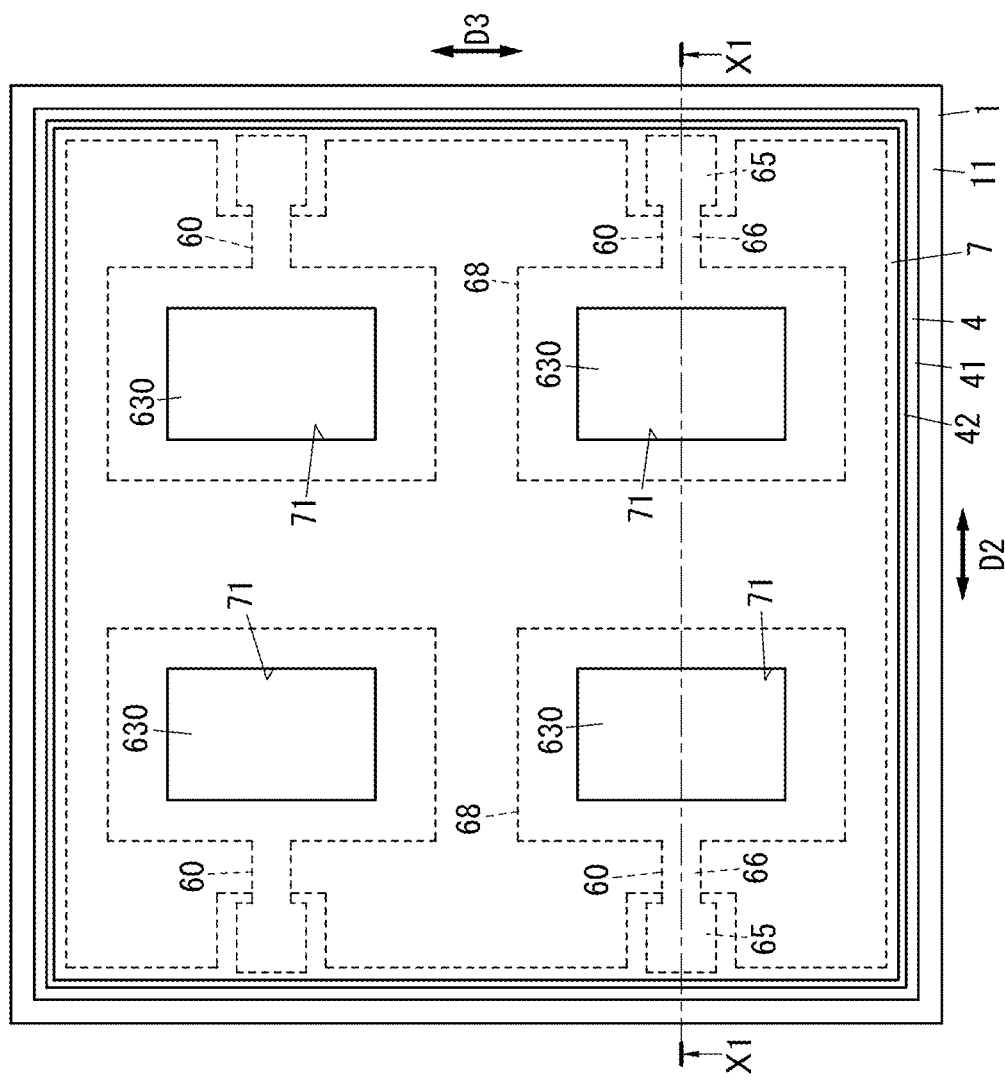
FIG. 4 is a plan view illustrating the method for producing the electronic component.

As shown in FIG. 3, the electrically conductive layer preferably has a multilayer structure including the first layer 61, the second layer 62, and the third layer 630. As shown in FIGS. 3 and 4, in the electrically conductive layers 60, a portion of a surface of the third layer 630 that is opposite to the second layer 62 side is exposed through the opening 71. The first layer 61 and the second layer 62 in the electrically conductive layer 60 are preferably the same as the first layer 61 and the second layer 62 in the electrically conductive layer 6. Specifically, the first layer 61 and the second layer 62 in the electrically conductive layer 60 are preferably, for example, a Cu layer and a Ni layer, respectively. The material and thickness of the third layer 630 in the electrically conductive layer 60 are the same as the material and thickness of the third layer 63 in the electrically conductive layer 6. The third layer 630 in the electrically conductive layer 60 is preferably, for example, an Au layer.

The thickness of the alloy layer 9 is larger than the thickness of the third layer 63. As shown in FIGS. 1 and 2, the alloy layer 9 is connected to the third layer 63 of the electrically conductive layer 6 in in-plane directions orthogonal to the thickness direction D1 of the substrate 1. The alloy layer is connected to the second layer 62 of the electrically conductive layer 6 and the solder bump 8 in the thickness direction D1 of the substrate 1.

The alloy layer 9 is larger than the opening 71 in a plan view in the thickness direction D1 of the substrate 1. The alloy layer 9 preferably includes a base portion 90 that is a portion of the alloy layer 9 provided within the thickness of the electrically conductive layer 6; and a protruding portion 91 protruding from the base portion 90 toward the solder bump 8 in the thickness direction D1 of the substrate 1. The protruding portion 91 is located within the opening 71 of the protective film 7. The outer circumferential shape of the protruding portion 91 is preferably the same or substantially the same as the outer circumferential shape of the end portion 81 of the solder bump 8. The outer circumferential surface of the protruding portion 91 is in contact with the inner circumferential surface of the opening 71 in the protective film 7. An extending portion 900 of the base portion 90 (a portion of the alloy layer 9) that surrounds the protruding portion 91 in a plan view in the thickness direction D1 of the substrate 1 is located between the protective film 7 and the second layer 62 of the electrically conductive layer 6 in the thickness direction D1 of the substrate 1.

(3) Method for Producing Electronic Component

An example of a preferred embodiment of a method for producing the electronic component 100 will be described briefly.

In the method for producing the electronic component 100, the substrate 1 is first prepared, and then a first step to an eighth step are performed.

In the first step, the functional element portions 2 are formed on the front surface 11 side of the substrate 1. More particularly, in the first step, the functional element portions 2 each including the IDT electrode 21 are preferably formed by a lift-off method using a photolithography technique and a thin film forming technique. In the second step, the wiring layers 3 are formed on the front surface 11 side of the substrate 1. In the third step, the spacer layer 41 is formed on the front surface 11 side of the substrate 1 using, for example, a spin coating technique, the photolithography technique, etc. In the third step, the frame-shaped spacer layer 41 is formed, and, at the same time, first through holes are formed in the spacer layer 41 at positions in which the connection electrodes 5 are to be formed. In the fourth step, the cover layer 42 formed of a photosensitive resin film is bonded to the spacer layer 41 using a lamination technique. In the fifth step, the photolithography technique is used to form second through holes in the cover layer 42 at positions in which the connection electrodes 5 are to be formed. At this point, the second through holes are connected to the first through holes. In the sixth step, the connection electrodes 5 are formed by, for example, plating. In the seventh step, the electrically conductive layers 60 are formed by, for example, plating. In the eighth step, the spin coating technique, the photolithography technique, etc. are used to form the protective film 7 including the openings 71 to thus obtain the structure shown in FIGS. 3 and 4. In the eighth step, reflow treatment is performed to form the solder bumps 8 and the alloy layers 9. In the eighth step, for example, a solder paste is applied to the surfaces of the electrically conductive layers 60 and then melted in a reflow furnace to form the solder bumps 8 and the alloy layers 9.

In the method for producing the electronic component 100, a wafer on which a plurality of electronic components 100 can be formed is used as the substrate 1 in the first step to the eighth step. After the eighth step, a dicing step is performed to cut the wafer with a dicing machine, so that a plurality of electronic components 100 can be obtained from one wafer. In the dicing step, the dicing machine used is, for example, a dicing saw, a laser, etc.

(4) Relationship Among Connection Electrodes, Solder Bumps, Electrically Conductive Layers, Alloy Layers, and Protective Film As described above, the electronic component 100 preferably includes the plurality of sets of the wiring layer 3, the connection electrode 5, the electrically conductive layer 6, the solder bump 8, and the alloy layer 9. In each of the plurality of sets, the connection electrode 5 is structured such that at least a portion thereof does not overlap the solder bump 8 in a plan view in the thickness direction D1. In the electronic component 100 according to preferred embodiment 1, the connection electrode 5 is preferably spaced apart from the solder bump 8 in a plan view in the thickness direction D1 of the substrate 1. Therefore, in the electronic component 100 according to preferred embodiment 1, the connection electrode 5 is spaced apart from the solder bump 8 in the second direction D2. In the electronic component 100 according to preferred embodiment 1, as the distance between the connection electrode 5 and the solder bump 8 in a plan view in the thickness direction D1 increases, the length of a portion of the electrically conductive layer 6 that overlaps the protective film 7 in the thickness direction D1 of the substrate 1 increases.

The alloy layer 9 is formed by the reaction between molten solder (molten SnAgCu) and the third layer 630 (Au layer) of the electrically conductive layer 60 during the reflow treatment. Therefore, the alloy layer 9 may be peeled off the protective film 7, and a gap may be formed between the alloy layer 9 and the protective film 7. However, the electrically conductive layer 6 is in contact with the protective film 7 in a region between the alloy layer 9 and the edge 602 on the connection electrode 5 side in a plan view in the thickness direction D1. A portion of the protective film 7 is stacked on the region of the electrically conductive layer 6 that is located between the alloy layer 9 and the edge 602 on the connection electrode 5 side in a plan view in the thickness direction D1, and the protective film 7 and the electrically conductive layer 6 are in close contact with each other in this region. Specifically, the adhesion between the protective film 7 and the region of the electrically conductive layer 6 that is located between the alloy layer 9 and the edge 602 on the connection electrode 5 side in a plan view in the thickness direction D1 is substantially determined by, for example, the conditions when the protective film 7 is stacked on the electrically conductive layer 60 (components of a resin material that forms the protective film 7, the application conditions, the surface state and surface morphology of the electrically conductive layer 60).

The electrically conductive layer 6 surrounds the entire or substantially the entire circumference of the alloy layer 9 in a plan view in the thickness direction D1 of the substrate 1. A portion of the alloy layer 9 (the extending portion 900) is interposed between the protective film 7 and the cover portion 4 in the thickness direction D1 of the substrate 1. The length L6 of a portion of the electrically conductive layer 6 that overlaps the protective film 7 in the region between the alloy layer 9 and the edge 602 on the connection electrode 5 side in a plan view in the thickness direction D1 of the substrate 1 is preferably larger than the length L9 of a portion (the extending portion 900) of the alloy layer 9 that overlaps the protective film 7.

Moreover, the length L68 of a portion of the electrically conductive layer 6 that overlaps the protective film 7 in the second connection portion 68 is preferably larger than the length L9 of the portion (the extending portion 900) of the alloy layer 9 that overlaps the protective film 7. The length L6 is larger than the thickness of the electrically conductive layer 6. The length L68 is larger than the thickness of the electrically conductive layer 6 (in FIG. 1, the thickness of the electrically conductive layer 6 drawn is exaggerated).

In the electronic component 100 according to preferred embodiment 1, the maximum height roughness of the surface 601 of the electrically conductive layer 6 that is on the protective film 7 side is larger than the maximum height roughness of the surface 901 of the alloy layer 9 that is on the protective film 7 side.

The maximum height roughness is preferably, for example, about 1.6 μm. From the viewpoint of improving the adhesion between the electrically conductive layer 6 and the protective film 7, it is preferable that the maximum height roughness is preferably, for example, about 1 μm or more. The maximum height roughness is a value measured from a cross-sectional SEM (scanning electron microscope) image. The magnification of the cross-sectional SEM image when the maximum height roughness is measured is, for example, 10000×. The maximum height roughness is the sum of the maximum peak height and the maximum valley depth of the surface 601 of the electrically conductive layer 6 in the cross-sectional SEM image. The maximum height roughness of the surface 601 of the electrically conductive layer 6 that is on the protective film 7 side can be changed by, for example, changing the plating conditions for the second layer 62 in the course of production. Alternatively, the maximum height roughness of the surface 601 of the electrically conductive layer 6 that is on the protective film 7 side can be changed by subjecting the first layer 61 to etching or sandblast treatment in the course of production. In this case, since the second layer 62 and the third layer 63 are stacked on the surface of the first layer 61 subjected to the etching or sandblast treatment, the second layer 62 and the third layer 63 are also coarsened accordingly.

(4) Advantageous Effects

The electronic component 100 according to preferred embodiment 1 includes the substrate 1, the functional element portions 2, the wiring layers 3, the cover portion 4, the connection electrodes 5, the electrically conductive layers 6, the protective film 7, the solder bumps 8, and the alloy layers 9. The functional element portions 2 are on the front surface 11 side of the substrate 1. The wiring layers 3 are on the front surface 11 side of the substrate 1 and are electrically connected to the functional element portions 2. The cover portion 4 is on the front surface 11 side of the substrate 1 and protects the functional element portions 2. The connection electrodes 5 are on the wiring layers 3 and extend in the thickness direction D1 of the substrate 1. The electrically conductive layers 6 are on the cover portion 4 and on the connection electrodes 5 and electrically connected to the wiring layers 3 via the connection electrodes 5. The protective film 7 covers the cover portion 4 and the electrically conductive layers 6 and includes the openings 71 in the projection regions of a portion of the electrically conductive layers 6 in the thickness direction D1. The solder bumps 8 are electrically connected to the electrically conductive layers 6 via the openings 71. The alloy layers 9 are provided between the solder bumps 8 and the electrically conductive layers 6 in the thickness direction D1 to join the solder bumps 8 to the electrically conductive layers 6, and the composition and the combination of elements of the alloy layers 9 preferably differ from those of the solder bumps 8. The electronic component 100 according to preferred embodiment 1 includes the plurality of sets of the wiring layer 3, the connection electrode 5, the electrically conductive layer 6, the solder bump 8, and the alloy layer 9. The protective film 7 includes the plurality of openings 71 corresponding to the plurality of sets. In at least one set of the plurality of sets (all the sets in this case), the connection electrode 5 is structured such that at least a portion thereof does not overlap the solder bump 8 in a plan view in the thickness direction D1. The surface 601 of the electrically conductive layer 6 that is on the protective film 7 side is in contact with the protective film 7 in the region between the alloy layer 9 and the edge 602 on the connection electrode 5 side in a plan view in the thickness direction D1.

In each of the plurality of sets in the electronic component 100 according to preferred embodiment 1, the surface 601 of the electrically conductive layer 6 that is located on the protective film 7 side is preferably in contact (e.g., close contact) with the protective film 7 in a region between the alloy layer 9 and the edge 602 on the connection electrode 5 side in a plan view in the thickness direction D1. Therefore, even when moisture passes through a gap between the alloy layer 9 and the protective film 7, the moisture is unlikely to reach the connection electrode 5, so that the moisture is unlikely to reach the functional element portions 2. The moisture resistance of the electronic component 100 according to preferred embodiment 1 can thus be improved, and the reliability can be improved.

In each of the plurality of sets in the electronic component 100 according to preferred embodiment 1, the connection electrode 5 is spaced apart from the solder bump 8 in a plan view in the thickness direction D1 of the substrate 1. Therefore, in the electronic component 100 according to preferred embodiment 1, the distance from the solder bump 8 to the connection electrode 5 is longer than that when the connection electrode 5 includes a portion overlapping the solder bump 8 in a plan view in the thickness direction D1. In this case, moisture from the outside is unlikely to reach the connection electrode 5, and therefore the moisture resistance can be improved.

In each of the plurality of sets in the electronic component 100 according to preferred embodiment 1, the electrically conductive layer 6 surrounds the entire or substantially the entire circumference of the alloy layer 9. Therefore, in the electronic component 100 according to preferred embodiment 1, the moisture resistance can be further improved as compared with the case where the electrically conductive layer 6 does not surround the entire or substantially the entire circumference of the alloy layer 9.

In each of the plurality of sets in the electronic component 100 according to preferred embodiment 1, at least a portion of the alloy layer 9 is interposed between the protective film 7 and the electrically conductive layer 6 (the second layer 62 thereof) in the thickness direction D1 of the substrate 1. Therefore, in the electronic component 100 according to preferred embodiment 1, the joint strength between the solder bump 8 and the electrically conductive layer 6 can be improved as compared with the case where at least a portion of the alloy layer 9 is not interposed between the protective film 7 and the electrically conductive layer 6 (the second layer 62 thereof) in the thickness direction D1 of the substrate 1.

In each of the plurality of sets in the electronic component 100 according to preferred embodiment 1, the length L6 of the portion of the electrically conductive layer 6 that overlaps the protective film 7 in the region between the alloy layer 9 and the edge 602 on the connection electrode 5 side in a plan view in the thickness direction D1 of the substrate 1 is preferably larger than the length L9 of the portion of the alloy layer 9 that overlaps the protective film 7. Therefore, in the electronic component 100 according to preferred embodiment 1, the moisture resistance can be further improved as compared with the case where the length L6 is equal to or smaller than the length L9.

In each of the plurality of sets in the electronic component 100 according to preferred embodiment 1, the electrically conductive layer 6 preferably includes the Au layer (the third layer 63) that overlaps the protective film 7 in a plan view in the thickness direction D1 of the substrate 1. The Au layer (the third layer 63) is connected to the alloy layer 9. The alloy layer 9 preferably includes Au. Therefore, in the electronic component 100 according to preferred embodiment 1, the weather resistance of the electrically conductive layer 6 and the alloy layer 9 can be improved.

In each of the plurality of sets in the electronic component 100 according to preferred embodiment 1, the maximum height roughness of the surface 601 of the electrically conductive layer 6 that is located on the protective film 7 side is larger than the maximum height roughness of the surface 901 of the alloy layer 9 that is located on the protective film 7 side. Therefore, in the electronic component 100 according to preferred embodiment 1, the moisture resistance can be improved as compared with the case where the maximum height roughness of the surface 601 of the electrically conductive layer 6 that is located on the protective film 7 side is equal to or lower than the maximum height roughness of the surface 901 of the alloy layer 9 that is located on the protective film 7 side.

In each of the plurality of sets in the electronic component 100 according to preferred embodiment 1, the maximum height roughness of the surface 601 of the electrically conductive layer 6 that is located on the protective film 7 side is preferably about 1 μm or more, for example. Therefore, in the electronic component 100 according to preferred embodiment 1, the moisture resistance can be improved as compared with the case where the maximum height roughness of the surface 601 of the electrically conductive layer 6 that is located on the protective film 7 side is less than about 1 μm.

In each of the plurality of sets in the electronic component 100 according to preferred embodiment 1, the solder bump 8 overlaps the entire or substantially the entire opening 71 in a plan view in the thickness direction D1 of the substrate 1. Therefore, in the electronic component 100 according to preferred embodiment 1, the joint strength between the solder bump 8 and the electrically conductive layer 6 can be improved.

In the electronic component 100 according to preferred embodiment 1, the functional element portions 2 include the respective IDT electrodes 21. The substrate 1 has piezoelectricity at least in regions in which the IDT electrodes 21 are provided. The cover portion 4 includes the cover layer 42 and the spacer layer 41. The cover layer 42 opposes the substrate 1 in the thickness direction D1 and is spaced apart from the functional element portions 2. The spacer layer 41 has a frame shape. The spacer layer 41 is interposed between the substrate 1 and the cover layer 42 and surrounds the functional element portions 2 in a plan view in the thickness direction D1. In each of the plurality of sets, the connection electrode 5 passes through the cover portion 4 in the thickness direction D1. Therefore, in the electronic component 100 according to preferred embodiment 1, moisture from the outside can be prevented from reaching the IDT electrodes 21, so that the moisture resistance can be improved. The connection electrodes 5 pass through the spacer layer 41 and the cover layer 42 in the thickness direction D1. Therefore, in the electronic component 100 according to preferred embodiment 1, moisture from the outside can be prevented from reaching the IDT electrodes 21, so that the moisture resistance can be improved.

(5) Modifications of Preferred Embodiment 1

Figure 5:
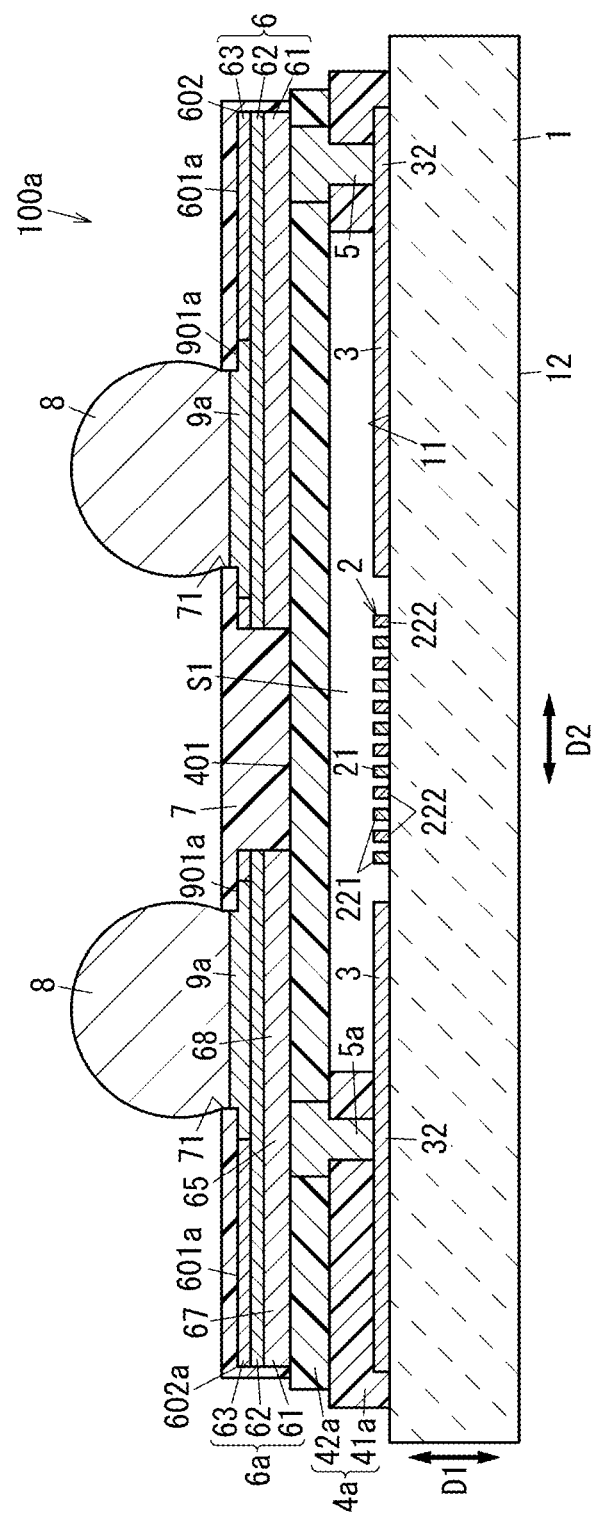
FIG. 5 is a cross-sectional view of an electronic component according to modification 1 of preferred embodiment 1 of the present invention.
Figure 6:
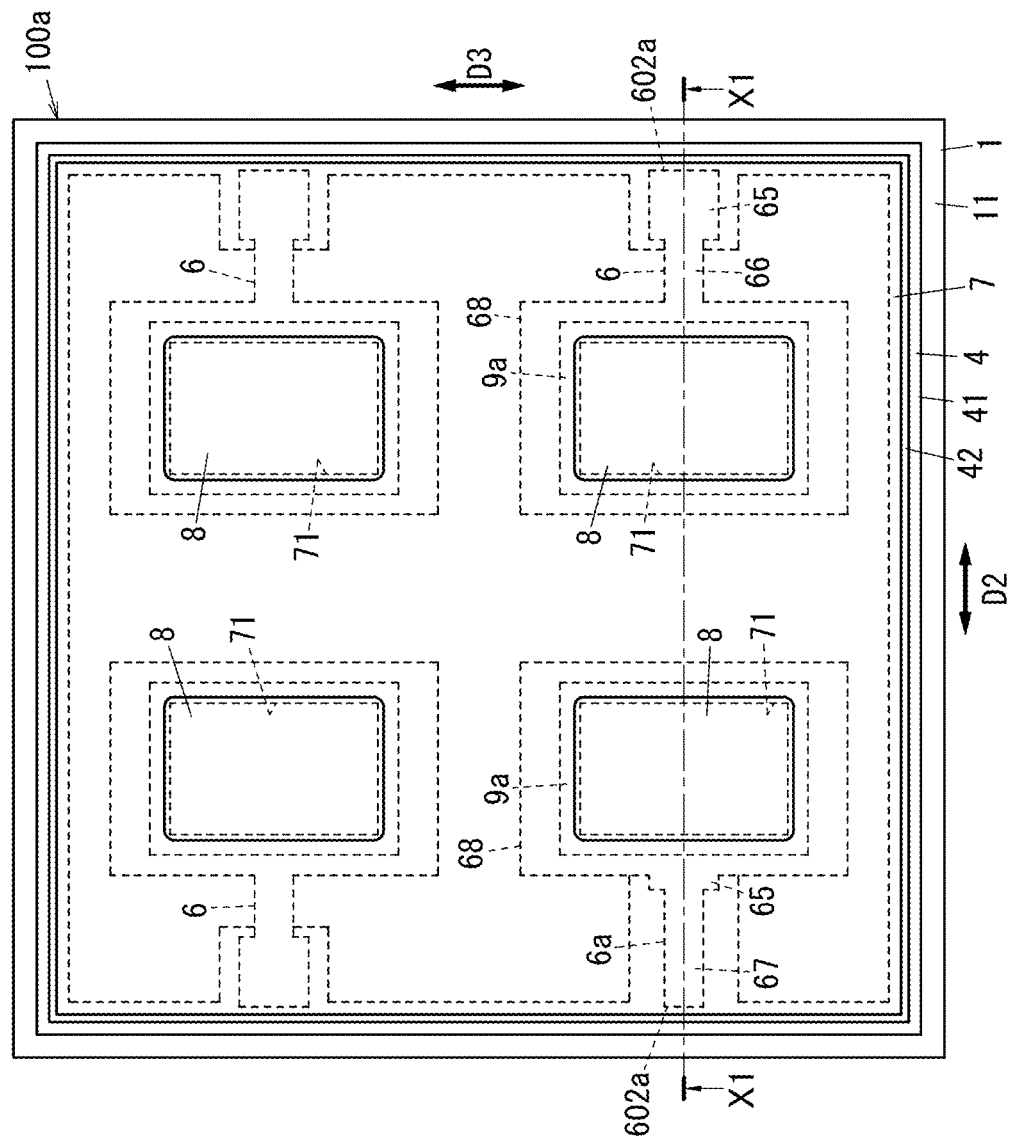
FIG. 6 is a plan view of the electronic component.

An electronic component 100a according to modification 1 of preferred embodiment 1 will be described referring to FIGS. 5 and 6.

The electronic component 100a according to modification of preferred embodiment 1 preferably includes a connection electrode 5a instead of one of the plurality of (four) connection electrodes 5 of the electronic component 100 according to preferred embodiment 1 (see FIGS. 1 and 2). Moreover, the electronic component 100a according to modification 1 of preferred embodiment 1 preferably includes a cover portion 4a instead of the cover portion 4 of the electronic component 100 according to preferred embodiment 1. The cover portion 4a includes a spacer layer 41a and a cover layer 42a. In the electronic component 100a according to modification 1 of preferred embodiment 1, the same elements and portions as those in the electronic component 100 according to preferred embodiment 1 are denoted by the same symbols, and their description will be omitted.

The shapes of the spacer layer 41a and the cover layer 42a are the same or substantially the same as those of the spacer layer 41 and the cover layer 42. The materials of the spacer layer 41a and the cover layer 42a are the same as the materials of the spacer layer 41 and the cover layer 42. The connection electrode 5a is a through electrode passing through the cover portion 4a in the thickness direction D1 of the substrate 1. The connection electrode 5a passes through the spacer layer 41a and the cover layer 42a. The connection electrode 5a is structured such that a portion thereof does not overlap a solder bump 8 in a plan view in the thickness direction D1 of the substrate 1. The multilayer structure of an electrically conductive layer 6a connected to the connection electrode 5a is the same as that of the electrically conductive layers 6. Specifically, the electrically conductive layer 6a preferably includes a first layer 61, a second layer 62, and a third layer 63, as do the electrically conductive layers 6.

In the electronic component 100a according to modification 1 of preferred embodiment 1, as in the electronic component 100 according to preferred embodiment 1, the electrically conductive layer 6a is connected to the connection electrode 5a, and a surface 601a of the electrically conductive layer 6a that is located on the protective film 7 side is in contact (close contact) with the protective film 7 in a region between an alloy layer 9a and an edge 602a on the connection electrode 5a side in a plan view in the thickness direction D1. Therefore, the moisture resistance can be improved. Moreover, in the electronic component 100a according to modification 1 of preferred embodiment 1, as in the electronic component 100 according to preferred embodiment 1, the maximum height roughness of the surface 601a of the electrically conductive layer 6a that is located on the protective film 7 side is preferably larger than the maximum height roughness of a surface 901a of the alloy layer 9a that is located on the protective film 7 side.

In the electronic component 100a according to modification 1 of preferred embodiment 1, the electrically conductive layer 6a includes an extending portion 67 extending from the first connection portion 65 toward the side opposite to the second connection portion 68 in a plan view in the thickness direction D1 of the substrate 1. Therefore, in the electronic component 100a according to modification 1 of preferred embodiment 1, the moisture resistance can be improved as compared with the case where the extending portion 67 is not included.

Figure 7A:
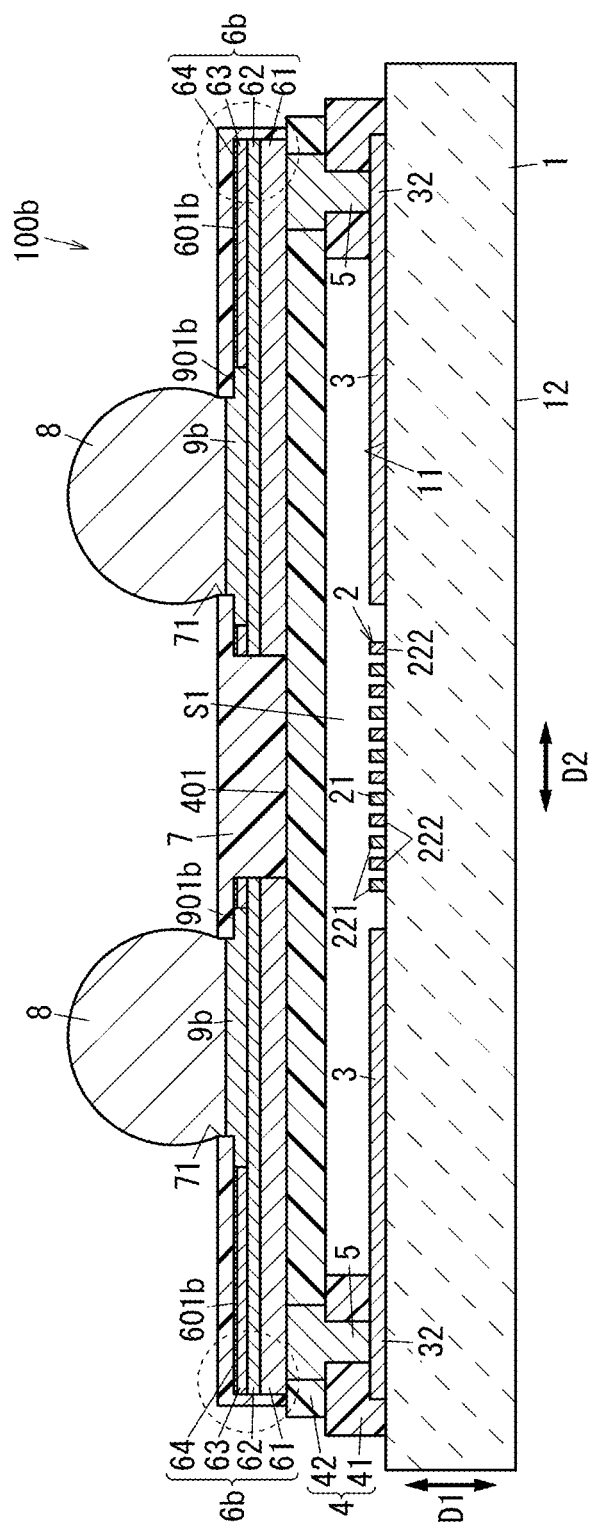
FIG. 7A is a cross-sectional view of an electronic component according to modification 2 of preferred embodiment 1 of the present invention.
Figure 7B:
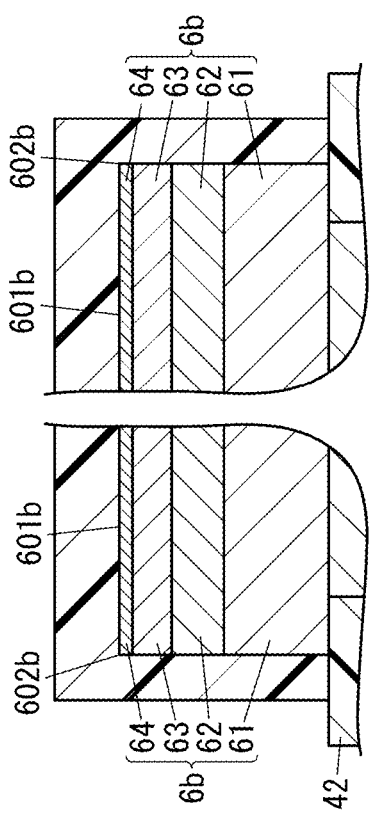
FIG. 7B is an enlarged view of an essential portion of FIG. 7A.

An electronic component 100b according to modification 2 of preferred embodiment 1 will be described referring to FIGS. 7A and 7B.

The electronic component 100b according to modification 2 of preferred embodiment 1 preferably includes a plurality of electrically conductive layers 6b instead of the plurality of electrically conductive layers 6 of the electronic component 100 according to preferred embodiment 1 (see FIGS. 1 and 2). In the electronic component 100b according to modification 2 of preferred embodiment 1, the same elements and portions as those in the electronic component 100 according to preferred embodiment 1 are denoted by the same symbols, and their description will be omitted.

Each of the electrically conductive layers 6b of the electronic component 100b according to modification 2 preferably includes, in addition to the first layer 61, the second layer 62, and the third layer 63, a close contact layer 64. The close contact layer 64 is interposed between the third layer 63 and the protective film 7. The close contact layer 64 has higher adhesion to the protective film 7 than the third layer 63.

In the electronic component 100b according to modification 2 of preferred embodiment 1, the protective film 7 preferably includes one material selected from the group consisting of an epoxy resin, a polyimide resin, and an acrylic resin, for example. The close contact layer 64 preferably includes one material selected from the group consisting of Ti, Cr, and NiCr, for example.

In the electronic component 100b according to modification 2 of preferred embodiment 1, as in the electronic component 100 according to preferred embodiment 1, a surface 601b of each of the electrically conductive layers 6b that is located on the protective film 7 side is in contact (close contact) with the protective film 7 in a region between a corresponding alloy layer 9 and an edge 602b on the connection electrode 5 side in a plan view in the thickness direction D1, and therefore the moisture resistance can be improved. In the electronic component 100b according to modification 2 of preferred embodiment 1, the electrically conductive layers 6b include the respective close contact layers 64. Therefore, the adhesion between the protective film 7 and the surface 601b of each electrically conductive layer 6b that is located on the protective film 7 side in the thickness direction D1 of the substrate 1 can be improved, so that the moisture resistance can be further improved. In the electronic component 100b according to modification 2 of preferred embodiment 1, as in the electronic component 100 according to preferred embodiment 1, the maximum height roughness of the surfaces 601b of the electrically conductive layers 6b that are located on the protective film 7 side is larger than the maximum height roughness of surfaces 901b of alloy layers 9b that are located on the protective film 7 side.

Preferred Embodiment 2

An electronic component 100c according to preferred embodiment 2 of the present invention will be described on the basis of FIG. 8.

The electronic component 100c according to preferred embodiment 2 preferably includes a plurality of electrically conductive layers 6c instead of the plurality of electrically conductive layers 6 of the electronic component 100 according to preferred embodiment 1 (see FIGS. 1 and 2). In the electronic component 100c according to preferred embodiment 2, the same elements and portions as those in the electronic component 100 according to preferred embodiment 1 are denoted by the same symbols, and their description will be omitted.

The electrically conductive layers 6c preferably include Cu, for example. More particularly, each of the electrically conductive layers 6c is preferably a Cu layer. Specifically, although the electrically conductive layers 6 of the electronic component 100 according to preferred embodiment 1 each have a multilayer structure, the electrically conductive layers 6c in preferred embodiment 2 each have a single layer structure. The electrically conductive layers 6c preferably include Cu as a base material, and any impurities may be added, for example.

In the electronic component 100c, the electrically conductive layers 6c are joined to the respective solder bumps 8 with respective alloy layers 9c interposed therebetween. The alloy layers 9c preferably include Sn and Cu, for example, as elements. The alloy layers 9c differ in at least composition from the solder bumps 8. Each alloy layer 9c is formed by the reaction between an electrically conductive layer 60c (see FIG. 9) and melted solder (hereinafter referred to as "molten solder") melted during reflow treatment in the course of production of the electronic component 100c. More particularly, each alloy layer 9c is formed by the reaction between the molten solder and the electrically conductive layer 60c (Cu layer) formed before the reflow treatment.

Figure 9:
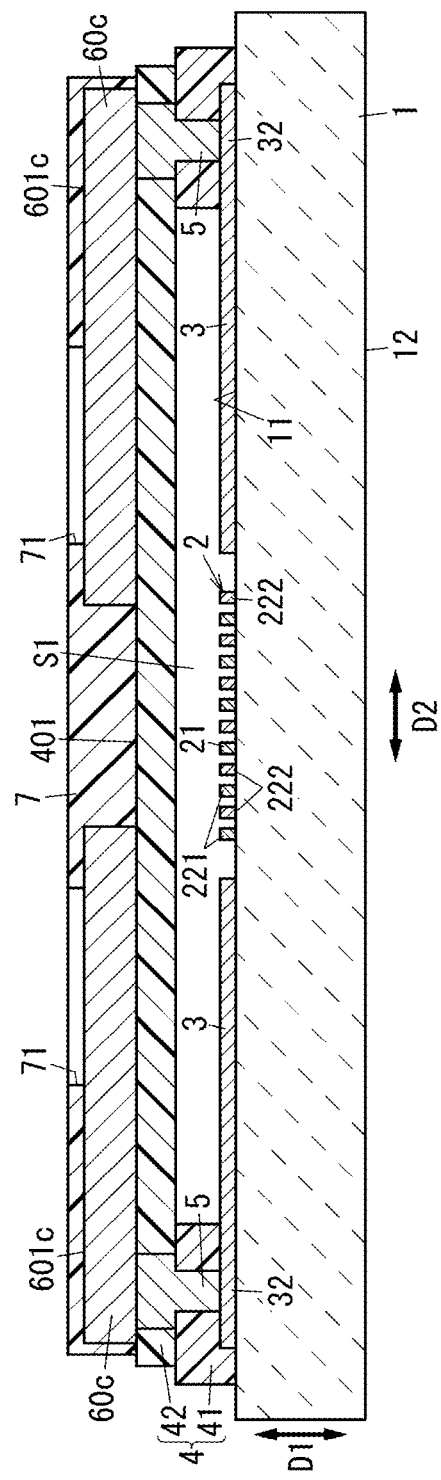
FIG. 9 is a cross-sectional view illustrating a preferred embodiment of a method for producing the electronic component.

The electrically conductive layers 60c are each preferably a single Cu layer, for example. As shown in FIG. 9, a portion of surfaces of the electrically conductive layers 60c that are located on the side opposite to the cover portion 4 are exposed through the respective openings 71. The material and thickness of the electrically conductive layers 60c are the same or substantially the same as the material and thickness of the electrically conductive layers 6c.

Figure 8:
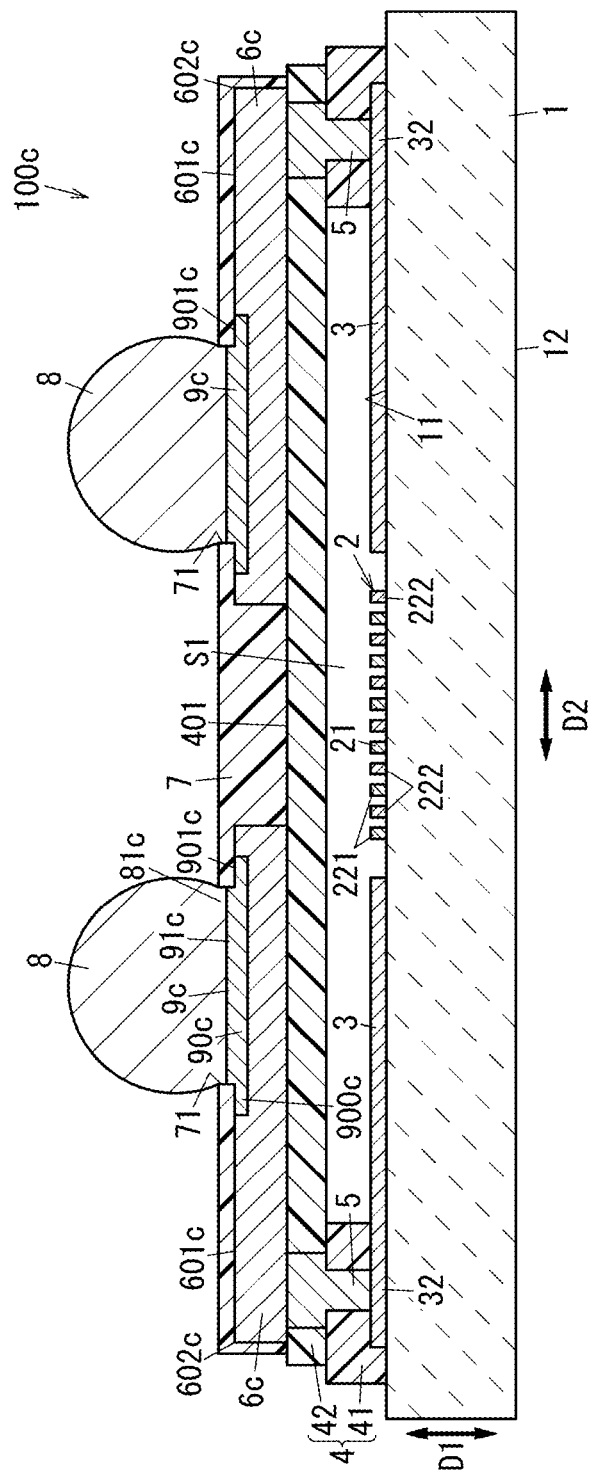
FIG. 8 is a cross-sectional view of an electronic component according to preferred embodiment 2 of the present invention.

As shown in FIG. 8, the alloy layers 9c are formed in the electrically conductive layers 6c so as to extend to intermediate positions in the thickness direction and do not pass through the electrically conductive layers 6c. The alloy layers 9c are connected to the electrically conductive layers 6c in in-plane directions orthogonal or substantially orthogonal to the thickness direction D1 of the substrate 1. The alloy layers 9c are connected, in the thickness direction D1 of the substrate 1, to the solder bumps 8 and portions of the electrically conductive layers 6c that are located directly below the alloy layers 9c.

The alloy layers 9c are larger than the openings 71 in a plan view in the thickness direction D1 of the substrate 1. Each alloy layer 9c includes a base portion 90c that is a portion of the alloy layer 9c formed within the thickness of a corresponding electrically conductive layer 6c; and a protruding portion 91c protruding from the base portion 90c toward a corresponding solder bump 8 in the thickness direction D1 of the substrate 1. The protruding portion 91c is located inside a corresponding opening 71 of the protective film 7. The outer circumferential shape of the protruding portion 91c is the same or substantially the same as the outer circumferential shape of an end portion 81c of the solder bump 8. The outer circumferential surface of the protruding portion 91c is in contact with the inner circumferential surface of the opening 71 of the protective film 7. An extending portion 900c (a portion of the alloy layers 9c) of the base portion 90c that surrounds the protruding portion 91c in a plan view in the thickness direction D1 of the substrate 1 is located between the protective film 7 and the electrically conductive layer 6c in the thickness direction D1 of the substrate 1.

In the electronic component 100c according to preferred embodiment 2, as in the electronic component 100 according to preferred embodiment 1, a surface 601c of each electrically conductive layer 6c that is located on the protective film 7 side is in contact (close contact) with the protective film 7 in a region between a corresponding alloy layer 9c and an edge 602c on the connection electrode 5 side in a plan view in the thickness direction D1, and therefore the moisture resistance can be improved. In the electronic component 100c according to preferred embodiment 2, as in the electronic component 100 according to preferred embodiment 1, the maximum height roughness of the surfaces 601c of the electrically conductive layers 6c that are located on the protective film 7 side is larger than the maximum height roughness of surfaces 901c of the alloy layers 9c that are located on the protective film 7 side. The maximum height roughness of the surfaces 601c of the electrically conductive layers 6c that are located on the protective film 7 side can be changed by subjecting the electrically conductive layers 6c to, for example, etching or a sandblast treatment in the course of production.

Preferred Embodiment 3

Figure 10:
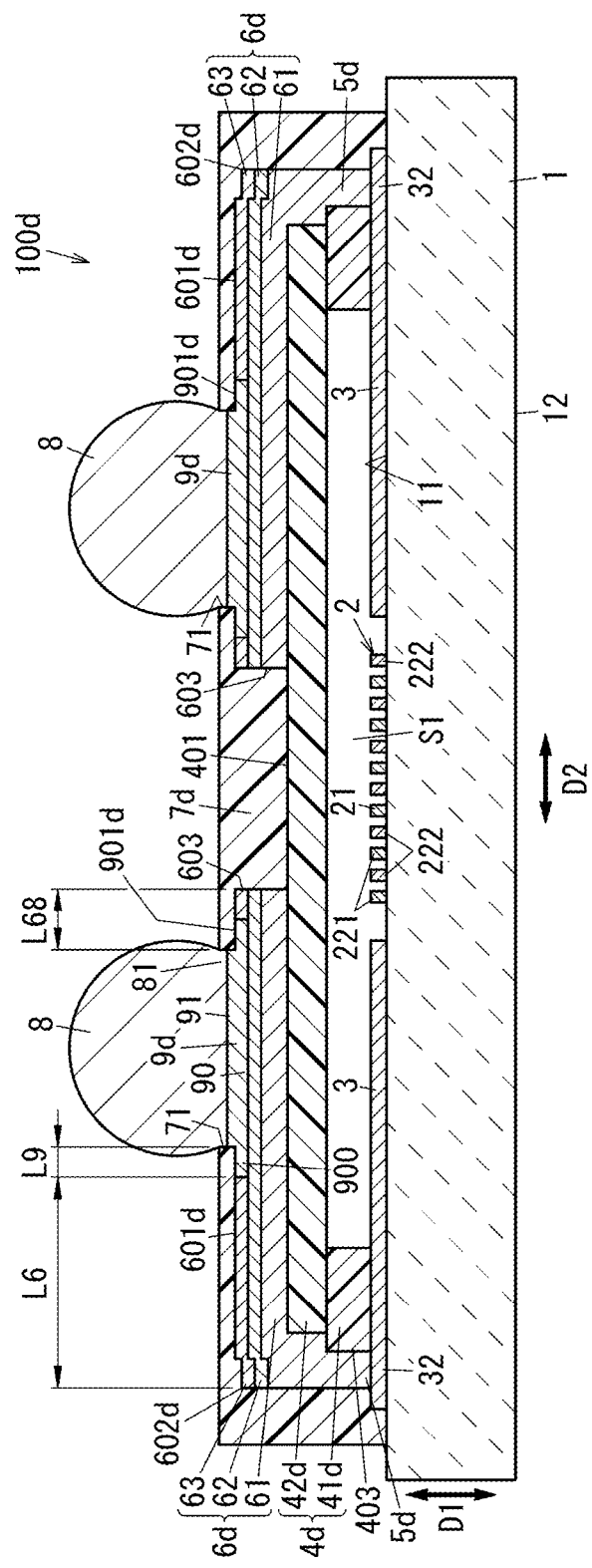
FIG. 10 is a cross-sectional view of an electronic component according to preferred embodiment 3 of the present invention.

An electronic component 100d according to preferred embodiment 3 of the present invention will be described referring to FIG. 10.

The electronic component 100d according to preferred embodiment 3 preferably includes a plurality of electrically conductive layers 6d instead of the plurality of electrically conductive layers 6 of the electronic component 100 according to preferred embodiment 1 (see FIGS. 1 and 2). Moreover, the electronic component 100d according to preferred embodiment 3 preferably includes a cover portion 4d, a plurality of connection electrodes 5d, and a protective film 7d instead of the cover portion 4, the plurality of connection electrodes 5, and the protective film 7, respectively, of the electronic component 100 according to preferred embodiment 1. In the electronic component 100d according to preferred embodiment 3, the same elements and portions as those in the electronic component 100 according to preferred embodiment 1 are denoted by the same symbols, and their description will be omitted.

The cover portion 4d includes a spacer layer 41d and a cover layer 42d, as does the cover portion 4. The outer and inner circumferential shapes of the spacer layer 41d are the same or substantially the same as the outer and inner circumferential shapes of the spacer layer 41. The outer circumferential shape of the cover layer 42a is the same or substantially the same as the outer circumferential shape of the cover layer 42. The material of the spacer layer 41d and the material of the cover layer 42d are preferably the same as the material of the spacer layer 41 and the material of the cover layer 42, respectively.

The connection electrodes 5d are on the wiring layers 3 and extend in the thickness direction D1 of the substrate 1.

The electrically conductive layers 6d are on the cover portion 4d and on the connection electrode 5a and are electrically connected to the wiring layers 3 via the connection electrodes 5d.

Each electrically conductive layer 6d preferably includes a first layer 61, a second layer 62, and a third layer 63, as does the electrically conductive layer 6 of the electronic component 100 according to preferred embodiment 1.

The material of the connection electrodes 5d is the same as the material of the first layers 61 of the electrically conductive layers 6d. The connection electrodes 5d are formed integrally with the respective first layers 61.

The protective film 7d covers a surface 401 of the cover portion 4d and also covers an outer circumferential surface 403 of the cover portion 4d. The protective film 7d covers the outer circumferential surface 403 of the cover portion 4d so as to cover the connection electrodes 5d provided on the outer circumferential surface 403 of the cover portion 4d. The material of the protective film 7d is the same as the material of the protective film 7.

In the electronic component 100d according to preferred embodiment 3, as in the electronic component 100 according to preferred embodiment 1, a surface 601d of each electrically conductive layer 6d that is located on the protective film 7 side is in contact (close contact) with the protective film 7 in a region between a corresponding alloy layer 9d and an edge 602d on the connection electrodes 5d side in a plan view in the thickness direction D1, and therefore the moisture resistance can be improved. Moreover, in the electronic component 100d according to preferred embodiment 3, as in the electronic component 100 according to preferred embodiment 1, the maximum height roughness of the surfaces 601d of the electrically conductive layers 6d that are located on the protective film 7 side is larger than the maximum height roughness of surfaces 901d the alloy layers 9d that are located on the protective film 7 side.

In the electronic component 100d according to preferred embodiment 3, each connection electrode 5d extends along one side surface of the outer circumferential surface 403 of the cover portion 4d to a corresponding wiring layer 3 and connected to this wiring layer 3. The protective film 7d covers the wiring layers 3. Therefore, in the electronic component 100d according to preferred embodiment 3, the flexibility in selection of the material of the substrate 1 is higher than that when through electrodes are formed in the substrate 1.

Preferred Embodiment 4

An electronic component 100e according to preferred embodiment 4 of the present invention will be described referring to FIG. 11.

The electronic component 100e according to preferred embodiment 4 preferably includes a substrate 1e instead of the substrate 1 of the electronic component 100 according to preferred embodiment 1 (see FIGS. 1 and 2). Moreover, the electronic component 100e according to preferred embodiment 4 preferably includes a cover portion 4e, a plurality of connection electrodes 5e, a plurality of electrically conductive layers 6e, and a protective film 7e instead of the cover portion 4, the plurality of connection electrodes 5, the plurality of electrically conductive layers 6, and the protective film 7, respectively, of the electronic component 100 according to preferred embodiment 1. In the electronic component 100e according to preferred embodiment 4, the same elements and portions as those in the electronic component 100 according to preferred embodiment 1 are denoted by the same symbols, and their description will be omitted.

The substrate 1e is a laminated substrate. The substrate 1e preferably includes a support substrate 14, a low-acoustic velocity film 15, and a piezoelectric thin film 16. The support substrate 14 supports a multilayer body including the low-acoustic velocity film 15 and the piezoelectric thin film 16. The acoustic velocity of bulk waves propagating through the support substrate is higher than the acoustic velocity of acoustic waves propagating through the piezoelectric thin film 16. The low-acoustic velocity film 15 is provided directly or indirectly on the support substrate 14. The acoustic velocity of bulk waves propagating through the low-acoustic velocity film 15 is lower than the acoustic velocity of acoustic waves propagating through the piezoelectric thin film 16. The piezoelectric thin film 16 is provided directly or indirectly on the low-acoustic velocity film 15. The piezoelectric thin film 16 is preferably made of, for example, $LiTaO_3$. The support substrate 14 is preferably, for example, a silicon film. The low-acoustic velocity film 15 is preferably, for example, a silicon oxide film.

The cover portion 4e preferably includes a spacer layer 41e and a cover layer 42e, as does the cover portion 4. The outer and inner circumferential shapes of the spacer layer 41e are preferably the same or substantially the same as the outer and inner circumferential shapes of the spacer layer 41. The outer circumferential shape of the cover layer 42e is preferably the same or substantially the same as the outer circumferential shape of the cover layer 42. The material of the spacer layer 41e and the material of the cover layer 42e are preferably the same as the material of the spacer layer 41 and the material of the cover layer 42, respectively.

The electronic component 100e preferably includes a plurality of sets of the wiring layer 3, the connection electrode 5e, the electrically conductive layer 6e, the solder bump 8, and an alloy layer 9e. In each of the plurality of sets, the connection electrode 5e is on the wiring layer 3 and extends in the thickness direction D1 of the substrate 1e. The connection electrode 5e is a through electrode passing though the substrate 1e in the thickness direction D1 of the substrate 1e. The substrate 1e includes an electrically insulating film 19 that electrically insulates the support substrate 14 from the plurality of connection electrodes 5e, the plurality of wiring layers 3, and the plurality of electrically conductive layers 6e. In the electronic component 100e according to preferred embodiment 4, a portion of the electrically insulating film 19 that is located below the piezoelectric thin film 16 also defines and functions as the low-acoustic velocity film 15. The low-acoustic velocity film 15 may be on the electrically insulating film 19. In the electronic component 100e, the substrate 1e may include, for example, a close contact layer interposed between the low-acoustic velocity film 15 and the piezoelectric thin film 16. In this case, the adhesion between the low-acoustic velocity film 15 and the piezoelectric thin film 16 can be improved. The close contact layer is preferably made of, for example, a resin (such as an epoxy resin or a polyimide resin), a metal, etc. In the electronic component 100e, the substrate 1e may include, instead of the close contact layer, a dielectric film between the low-acoustic velocity film 15 and the piezoelectric thin film 16, on the piezoelectric thin film 16, or under the low-acoustic velocity film 15.

Each electrically conductive layer 6e includes a first layer 61, a second layer 62, and a third layer 63, as do the electrically conductive layers 6 of the electronic component 100 according to preferred embodiment 1 (see FIG. 1).

The protective film 7e covers a back surface 12e of the substrate 1e and the plurality of electrically conductive layers 6e and includes openings 71 in projection regions of a portion of the electrically conductive layers 6e in the thickness direction D1 of the substrate 1.

The electronic component 100e according to preferred embodiment 4 preferably includes the substrate 1e, the functional element portions 2, the wiring layers 3, the cover portion 4e, the connection electrodes 5e, the electrically conductive layers 6e, the protective film 7e, the solder bumps 8, and the alloy layers 9e. The functional element portions 2 are on the front surface 11e side of the substrate 1e. The wiring layers 3 are on the front surface 11e side of the substrate 1e and electrically connected to the functional element portions 2. The cover portion 4e is on the front surface 11e side of the substrate 1e and protects the functional element portions 2. The connection electrodes 5e are on the wiring layers 3 and extend in the thickness direction D1 of the substrate 1e. The electrically conductive layers 6e are on the back surface 12e of the substrate 1e that is opposite to the front surface 11e and on the connection electrodes 5e and are electrically connected to the wiring layers 3 via the connection electrodes 5e. The protective film 7e covers the back surface 12e of the substrate 1e and the electrically conductive layers 6e and includes the openings 71 in projection regions of a portion of the electrically conductive layers 6e in the thickness direction D1. The solder bumps 8 are electrically connected to the electrically conductive layers 6e via the openings 71. Each alloy layer 9e is provided between a corresponding solder bump 8 and a corresponding electrically conductive layer 6e in the thickness direction D1 to join the solder bump 8 to the electrically conductive layer 6e. The alloy layers 9e preferably differ in at least one of composition and a combination of elements from the solder bumps 8. The electronic component 100e according to preferred embodiment 4 includes a plurality of sets of the wiring layer 3, the connection electrode 5e, the electrically conductive layer 6e, the solder bump 8, and the alloy layer 9e. The plurality of openings 71 corresponding to the plurality of sets are provided in the protective film 7e. In at least one set of the plurality of sets (preferably all the sets in this case), the connection electrode 5e is disposed such that at least a portion thereof does not overlap the solder bump 8 in a plan view in the thickness direction D1. The surface 601e of the electrically conductive layer 6e that is located on the protective film 7e side is in contact with the protective film 7e in a region between the alloy layer 9e and an edge 602e on the connection electrode 5e side in a plan view in the thickness direction D1.

In each of the plurality of sets in the electronic component 100e according to preferred embodiment 4, as in the electronic component 100 according to preferred embodiment 1, the surface 601e of the electrically conductive layer 6e that is located on the protective film 7e side is in contact (e.g., in close contact) with the protective film 7 in the region between the alloy layer 9e and the edge 602e on the connection electrode 5e side in a plan view in the thickness direction D1, and therefore the moisture resistance can be improved.

In each of the plurality of sets in the electronic component 100e according to preferred embodiment 4, the connection electrode 5e is spaced apart from the solder bump 8 in a plan view in the thickness direction D1. Therefore, in the electronic component 100e according to preferred embodiment 4, the distance from the solder bump 8 to the connection electrode 5e is longer than that when the connection electrode 5e includes a portion overlapping the solder bump 8 in a plan view in the thickness direction D1. In this case, moisture from the outside is unlikely to reach the connection electrode 5e, and therefore the moisture resistance can be improved.

In each of the plurality of sets in the electronic component 100e according to preferred embodiment 4, the electrically conductive layer 6e surrounds the entire or substantially the entire circumference of the alloy layer 9e. Therefore, in the electronic component 100e according to preferred embodiment 4, the moisture resistance can be further improved as compared with the case where the electrically conductive layer 6e does not surround the entire circumference of the alloy layer 9e.

In each of the plurality of sets in the electronic component 100e according to preferred embodiment 4, at least a portion of the alloy layer 9e is interposed between the protective film 7e and the electrically conductive layer 6e (the second layer 62 thereof) in the thickness direction D1 of the substrate 1e. Therefore, in the electronic component 100e according to preferred embodiment 4, the joint strength between the solder bump 8 and the electrically conductive layer 6e can be improved as compared with the case where at least a portion of the alloy layer 9e is not interposed between the protective film 7e and the electrically conductive layer 6e in the thickness direction D1 of the substrate 1e.

In each of the plurality of sets in the electronic component 100e according to preferred embodiment 4, the length L6 of a portion of the electrically conductive layer 6e that overlaps the protective film 7e in the region between the alloy layer 9e and the edge 602e on the connection electrode 5e side in a plan view in the thickness direction (D1) is preferably larger than the length L9 of a portion of the alloy layer 9e that overlaps the protective film 7e. Therefore, in the electronic component 100e according to preferred embodiment 4, the moisture resistance can be further improved.

In each of the plurality of sets in the electronic component 100e according to preferred embodiment 4, the electrically conductive layer 6e includes an Au layer (the third layer 63) that overlaps the protective film 7e in a plan view in the thickness direction D1. The Au layer (the third layer 63) is connected to the alloy layer 9e. The alloy layer 9e includes Au. Therefore, in the electronic component 100e according to preferred embodiment 4, the weather resistance of the electrically conductive layer 6e and the alloy layer 9e can be improved.

An electronic component 100f according to a modification of preferred embodiment 4 will be described referring to 12A and 12B.

Figure 11:
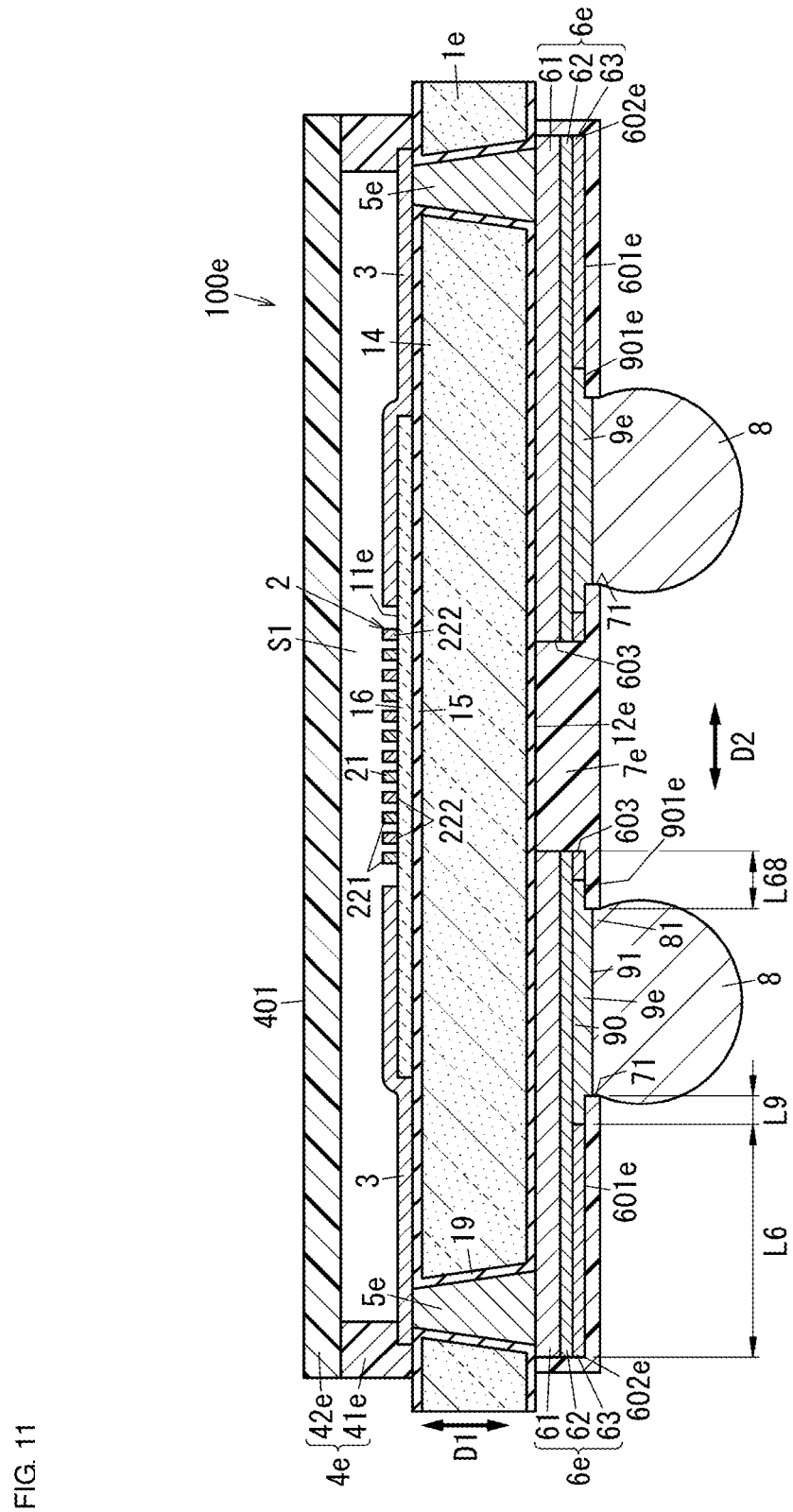
FIG. 11 is a cross-sectional view of an electronic component according to preferred embodiment 4 of the present invention.
Figure 12A:
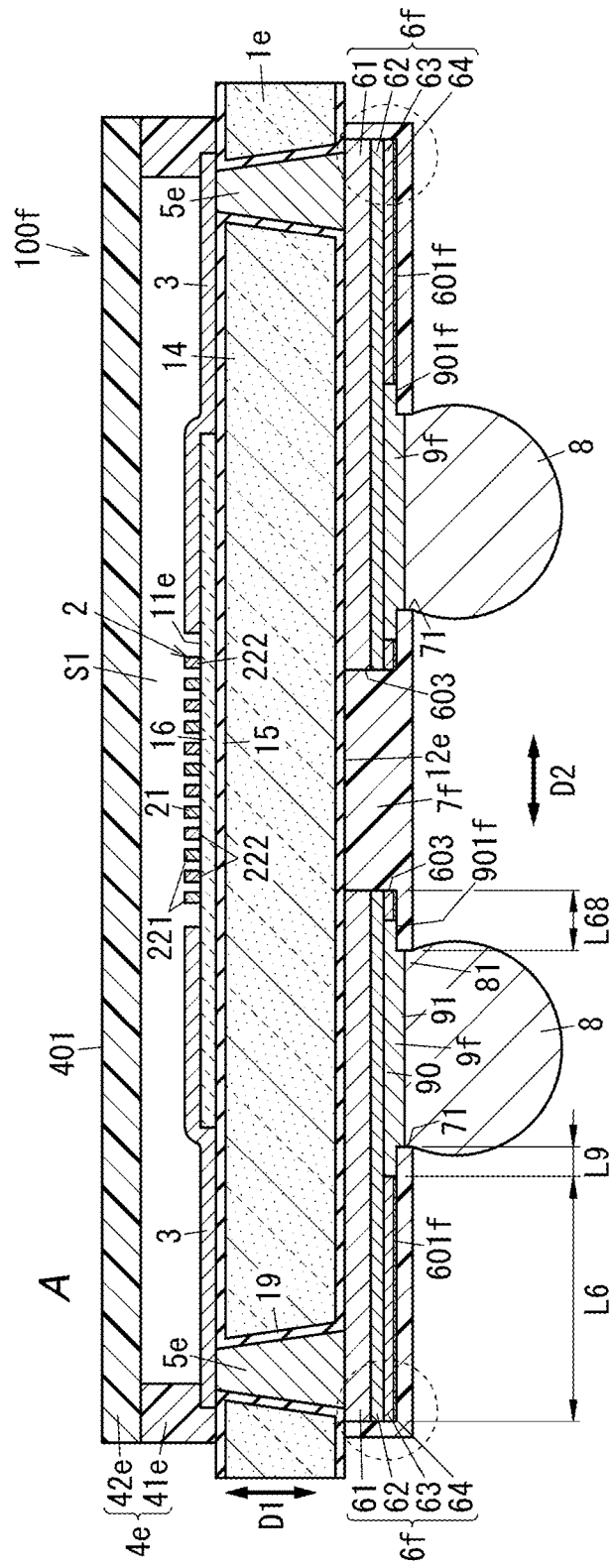
FIG. 12A is a cross-sectional view of an electronic component according to a modification of preferred embodiment 4 of the present invention.
Figure 12B:
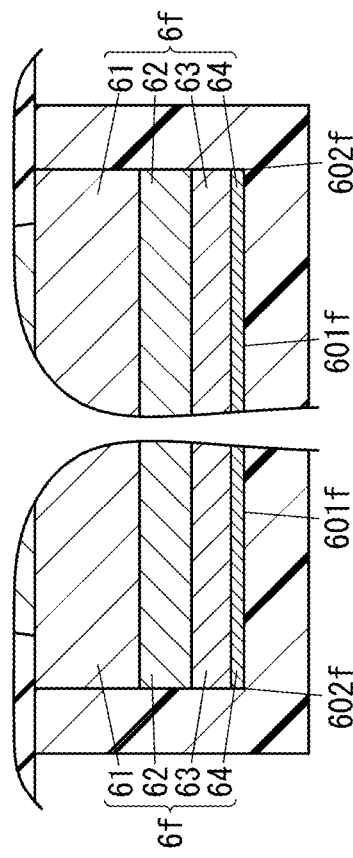
FIG. 12B is an enlarged view of an essential part of FIG. 12A.

The electronic component 100f according to the modification of preferred embodiment 4 preferably includes a plurality of electrically conductive layers 6f instead of the plurality of electrically conductive layers 6e of the electronic component 100e according to preferred embodiment 4 (see FIG. 11). In the electronic component 100f according to the modification of preferred embodiment 4, the same elements and portions as those in the electronic component 100e according to preferred embodiment 4 are denoted by the same symbols, and their description will be omitted.

Each of the plurality of electrically conductive layers 6f of the electronic component 100f preferably includes a first layer 61, a second layer 62, and a third layer 63 and further includes a close contact layer 64. The close contact layer 64 is interposed between the third layer 63 and the protective film 7f. The close contact layer 64 has higher adhesion to the protective film 7f than the third layer 63.

In the electronic component 100f, the protective film 7f preferably includes one material selected from the group consisting of an epoxy resin, a polyimide resin, and an acrylic resin, for example. The close contact layer 64 preferably includes one material selected from the group consisting of Ti, Cr, and NiCr, for example.

In the electronic component 100f according to the modification of preferred embodiment 4, as in the electronic component 100e according to preferred embodiment 4, a surface 601f of each of the electrically conductive layers 6f that is located on the protective film 7f side is in contact (e.g., in close contact) with the protective film 7f in a region between a corresponding alloy layer 9f and an edge 602f on the connection electrode 5e side in a plan view in the thickness direction D1, and therefore the moisture resistance can be improved. In the electronic component 100f according to the modification of preferred embodiment 4, the electrically conductive layers 6f include the respective close contact layer 64. Therefore, the adhesion between the protective film 7f and the surface 601f of each electrically conductive layer 6f that is located on the protective film 7f side in the thickness direction D1 of the substrate 1e can be improved, so that the moisture resistance can be further improved. In the electronic component 100f according to the modification of preferred embodiment 4, as in the electronic component 100e according to preferred embodiment 4, the maximum height roughness of the surfaces 601f of the electrically conductive layers 6f that are located on the protective film 7f side is larger than the maximum height roughness of surfaces 901f of alloy layers 9f that are located on the protective film 7f side.

Preferred Embodiment 5

Figure 13:
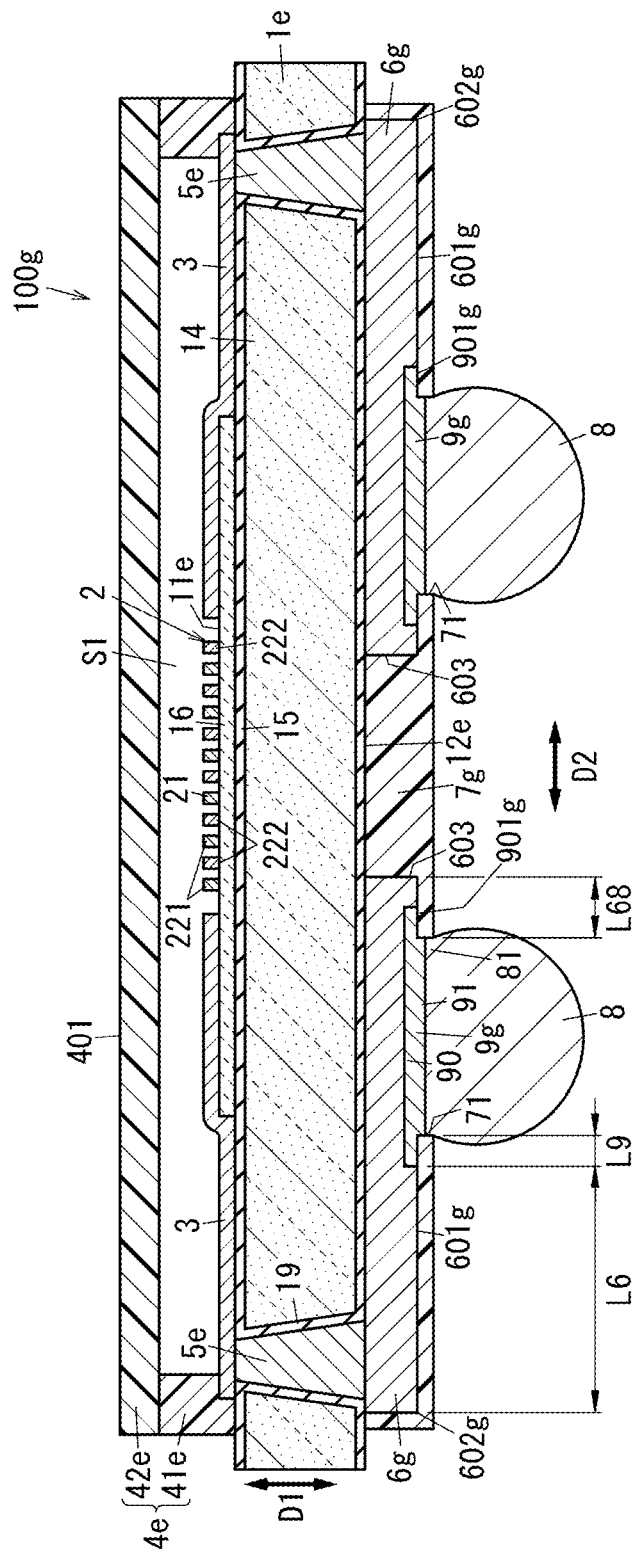
FIG. 13 is a cross-sectional view of an electronic component according to preferred embodiment 5 of the present invention.

An electronic component 100g according to preferred embodiment 5 of the present invention will be described referring to FIG. 13.

The electronic component 100g according to preferred embodiment 5 preferably includes a plurality of electrically conductive layers 6g instead of the plurality of electrically conductive layers 6e of the electronic component 100e according to preferred embodiment 4 (see FIG. 11). In the electronic component 100g according to preferred embodiment 5, the same elements and portions as those in the electronic component 100e according to preferred embodiment 4 are denoted by the same symbols, and their description will be omitted.

Each of the plurality of electrically conductive layers 6g preferably includes Cu, for example. More particularly, each of the plurality of electrically conductive layers 6g is preferably a Cu layer, for example. Specifically, although the electrically conductive layers 6e of the electronic component 100e according to preferred embodiment 4 each have a multilayer structure, the electrically conductive layers 6g in preferred embodiment 5 each have a single layer structure. The electrically conductive layers 6g preferably includes Cu as a base material, and any impurities may be added, for example.

The electronic component 100g according to preferred embodiment 5 includes a plurality of sets of the wiring layer 3, a connection electrode 5e, the electrically conductive layer 6g, the solder bump 8, and an alloy layer 9g. In each of the plurality of sets, the electrically conductive layer 6g is joined to the solder bump 8 via the alloy layer 9g. The alloy layers 9g include Sn and Cu as elements. The alloy layers 9g differ in at least composition from the solder bumps 8. Each alloy layer 9g is formed by the reaction between a Cu layer that later becomes a corresponding electrically conductive layer 6g and melted solder (hereinafter referred to as "molten solder") melted during reflow treatment in the course of production of the electronic component 100g. More particularly, each alloy layer 9g is formed by the reaction between the molten solder and the Cu layer (electrically conductive layer) formed before the reflow treatment.

The alloy layers 9g are provided in the electrically conductive layers 6g so as to extend to intermediate positions in the thickness direction and do not pass through the electrically conductive layers 6g. The alloy layers 9g are connected to the electrically conductive layers 6g in in-plane directions orthogonal to the thickness direction D1 of the substrate 1e. The alloy layers 9g are connected, in the thickness direction D1 of the substrate 1e, to the solder bumps 8 and portions of the electrically conductive layers 6g that are located directly below the alloy layers 9g.

The alloy layers 9g are larger than the openings 71 in a plan view in the thickness direction D1 of the substrate 1e. A portion of each alloy layer 9g is located between the protective film 7g and a corresponding electrically conductive layer 6g in the thickness direction D1 of the substrate 1e. In the electronic component 100g, the protective film 7g preferably includes one material selected from the group consisting of an epoxy resin, a polyimide resin, and an acrylic resin, for example.

In each of the plurality of sets in the electronic component 100g according to preferred embodiment 5, as in the electronic component 100e according to preferred embodiment 4, a surface 601g of the electrically conductive layer 6g that is located on the protective film 7g side is in contact (close contact) with the protective film 7g in a region between the alloy layer 9g and an edge 602g on the connection electrode 5e side in a plan view in the thickness direction D1, and therefore the moisture resistance can be improved. Moreover, in each of the plurality of sets in the electronic component 100g according to preferred embodiment 5, as in the electronic component 100e according to preferred embodiment 4, the maximum height roughness of the surface 601g of the electrically conductive layer 6g that is located on the protective film 7g side is larger than the maximum height roughness of a surface 901g of the alloy layer 9g that is located on the protective film 7g side. The maximum height roughness of the surface 601g of the electrically conductive layer 6g that is located on the protective film 7g side can be changed by subjecting the electrically conductive layer 6g to etching or sandblast treatment in the course of production.

Preferred Embodiment 6

Figure 14:
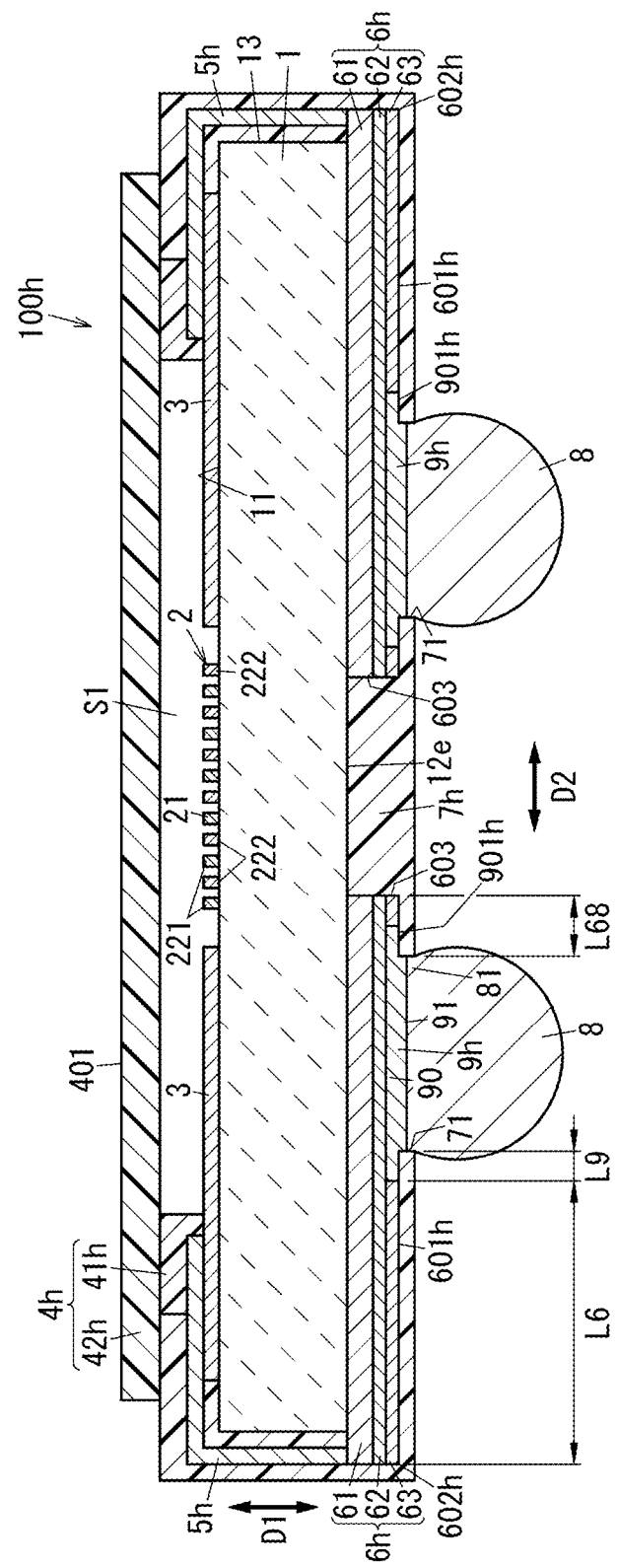
FIG. 14 is a cross-sectional view of an electronic component according to preferred embodiment 6 of the present invention.

An electronic component 100h according to preferred embodiment 6 of the present invention will be described referring to FIG. 14.

The electronic component 100h according to preferred embodiment 6 preferably includes a cover portion 4h, a plurality of connection electrodes 5h, a plurality of electrically conductive layers 6h, and a protective film 7h instead of the cover portion 4, the plurality of connection electrodes 5, the plurality of electrically conductive layers 6, and the protective film 7, respectively, of the electronic component 100 according to preferred embodiment 1 (see FIGS. 1 and 2). In the electronic component 100h according to preferred embodiment, the same elements and portions as those in the electronic component 100 according to preferred embodiment 1 are denoted by the same symbols, and their description will be omitted.

The cover portion 4h preferably includes a spacer layer 41h and a cover layer 42h, as does the cover portion 4. The outer and inner circumferential shapes of the spacer layer 41h are preferably the same or substantially the same as the outer and inner circumferential shapes of the spacer layer 41. The outer circumferential shape of the cover layer 42h is preferably the same or substantially the same as the outer circumferential shape of the cover layer 42. The material of the spacer layer 41h and the material of the cover layer 42h are the same as the material of the spacer layer 41 and the material of the cover layer 42, respectively.

The electronic component 100h according to preferred embodiment 6 preferably includes a plurality of sets of the wiring layer 3, the connection electrode 5h, the electrically conductive layer 6h, the solder bump 8, and an alloy layer 9h. In each of the plurality of sets, the connection electrode 5h is on the wiring layer 3 and extends in the thickness direction D1 of the substrate 1. In this case, the connection electrode 5h extends from the electrically conductive layer 6h side along one side surface of the outer circumferential surface 13 to the front surface 11 of the substrate 1 and is connected to the wiring layer 3. The connection electrode 5h include a portion provided along the one side surface of the outer circumferential surface 13 of the substrate 1; and a portion provided along the front surface 11 of the substrate 1.

Each of the electrically conductive layers 6h preferably includes a first layer 61, a second layer 62, and a third layer 63, as do the electrically conductive layers 6 of the electronic component 100 according to preferred embodiment 1.

The protective film 7h covers a back surface 12e of the substrate 1, the outer circumferential surface 13 of the substrate 1, a portion of the front surface 11 of the substrate 1 that is located outward of the cover portion 4h, the electrically conductive layers 6h, etc. and includes openings 71 in projection regions of a portion of the electrically conductive layers 6h in the thickness direction D1.

The electronic component 100h according to preferred embodiment 6 preferably includes the substrate 1, the functional element portions 2, the wiring layers 3, the cover portion 4h, the connection electrodes 5h, the electrically conductive layers 6h, the protective film 7h, the solder bumps 8, and alloy layers 9h. The functional element portions 2 are on the front surface 11 side of the substrate 1. The wiring layers 3 are on the front surface 11 side of the substrate 1 and are electrically connected to the functional element portions 2. The cover portion 4h is on the front surface 11 side of the substrate 1 and protects the functional element portions 2. The connection electrodes 5h are on the wiring layers 3 and extend in the thickness direction D1 of the substrate 1. The electrically conductive layers 6h are on the connection electrodes 5h and on the back surface 12 of the substrate 1 that is opposite to the front surface 11 and electrically connected to the wiring layers 3 via the connection electrodes 5h. The protective film 7h covers the back surface 12 of the substrate 1 and the electrically conductive layers 6h and includes the openings 71 in the projection regions of a portion of the electrically conductive layers 6h in the thickness direction D1. The solder bumps 8 are electrically connected to the electrically conductive layers 6h via the openings 71. The alloy layers 9h are provided between the solder bumps 8 and the electrically conductive layers 6h in the thickness direction D1 to join the solder bumps 8 to the electrically conductive layers 6h. The alloy layers 9h differ in at least one of composition and a combination of elements from the solder bumps 8. The electronic component 100h according to preferred embodiment 6 includes a plurality of sets of the wiring layer 3, the connection electrode 5h, the electrically conductive layer 6h, the solder bump 8, and the alloy layer 9*h*. The protective film 7*h* includes the plurality of openings 71 corresponding to the plurality of sets. In at least one set of the plurality of sets (all the sets in this case), the connection electrode 5*h* is structured such that at least a portion thereof does not overlap the solder bump 8 in a plan view in the thickness direction D1. A surface 601*h* of the electrically conductive layer 6*h* that is located on the protective film 7*h* side is in contact with the protective film 7*h* in a region between the alloy layer 9*h* and an edge 602*h* on the connection electrode 5*h* side in a plan view in the thickness direction D1.

In each of the plurality of sets in the electronic component 100*h* according to preferred embodiment 6, as in the electronic component 100 according to preferred embodiment 1, the surface 601*h* of the electrically conductive layer 6*h* that is located on the protective film 7*h* side is in contact (e.g., in close contact) with the protective film 7*h* in the region between the alloy layer 9*h* and the edge 602*h* on the connection electrode 5*h* side in a plan view in the thickness direction D1, and therefore the moisture resistance can be improved.

In each of the plurality of sets in the electronic component 100*h* according to preferred embodiment 6, the connection electrode 5*h* is preferably spaced apart from the solder bump 8 in a plan view in the thickness direction D1 of the substrate 1. Therefore, in the electronic component 100*h* according to preferred embodiment 6, the distance from the solder bump 8 to the connection electrode 5*h* is preferably longer than that when the connection electrode 5*h* includes a portion overlapping the solder bump 8 in a plan view in the thickness direction D2. In this case, moisture from the outside is unlikely to reach the connection electrode 5*h*, and therefore the moisture resistance can be improved.

In each of the plurality of sets in the electronic component 100*h* according to preferred embodiment 6, the connection electrode 5*h* extends along the outer circumferential surface 13 of the substrate 1 to the front surface 11 of the substrate 1 and is connected to the wiring layer 3. Therefore, in the electronic component 100*h* according to preferred embodiment 6, the flexibility in selection of the material of the substrate 1 is higher than that when through electrodes are provided in the substrate 1.

Preferred Embodiment 7

Figure 15:
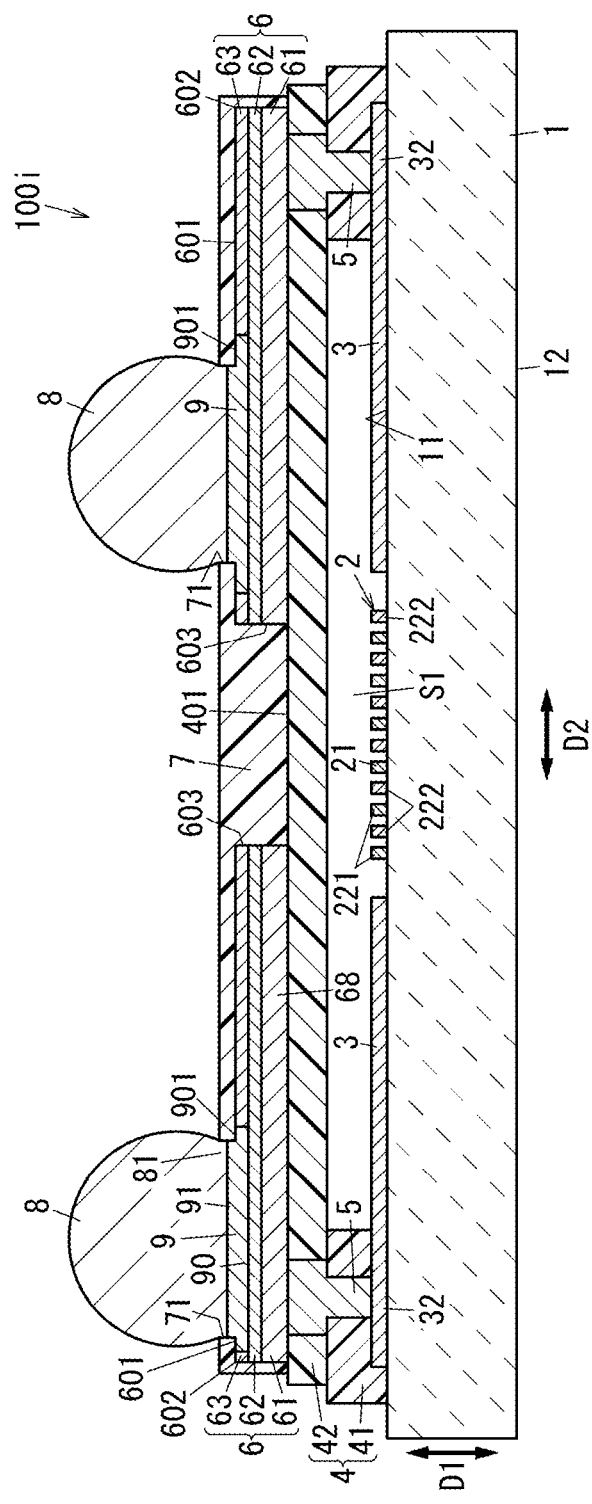
FIG. 15 is a cross-sectional view of an electronic component according to preferred embodiment 7 of the present invention.

An electronic component 100*i* according to preferred embodiment 7 of the present invention will be described referring to FIG. 15.

In the electronic component 100*i* according to preferred embodiment 7, one of the plurality of (four, for example) connection electrodes 5 of the electronic component 100 according to preferred embodiment 1 (see FIGS. 1 and 2) (i.e., the left connection electrode 5 in FIG. 15) is preferably structured to entirely or substantially entirely overlap one of the solder bumps 8 in a plan view in the thickness direction D1 of the substrate 1. In the electronic component 100*i* according to preferred embodiment 7, the same elements and portions as those in the electronic component 100 according to preferred embodiment 1 are denoted by the same symbols, and their description will be appropriately omitted.

The electronic component 100*i* according to preferred embodiment 7 preferably includes a plurality of sets of the wiring layer 3, the connection electrode 5, the electrically conductive layer 6, the solder bump 8, and the alloy layer 9, as does the electronic component 100 according to preferred embodiment 1. The protective film 7 includes a plurality of openings 71 corresponding to the plurality of sets.

In at least one (preferably, for example, three in this case) of the plurality of (preferably, for example, four in this case) sets in the electronic component 100*i* according to preferred embodiment 7, the connection electrode 5 is structured such that at least a portion thereof does not overlap the solder bump 8 in a plan view in the thickness direction D1. The surface 601 of the electrically conductive layer 6 that is located on the protective film 7 side is preferably in contact with the protective film 7 in a region between the alloy layer 9 and the edge 602 on the connection electrode 5 side in a plan view in the thickness direction D1. In the electronic component 100*i* according to preferred embodiment 7, in the rest of the plurality of sets different from the at least one set (the remaining one set in this case), the connection electrode 5 is disposed so as to entirely or substantially entirely overlap one of the solder bumps 8 in a plan view in the thickness direction D1.

In each of the plurality of sets in the electronic component 100*i* according to preferred embodiment 7, as in the electronic component 100 according to preferred embodiment 1, the surface 601 of the electrically conductive layer 6 that is located on the protective film 7 side is in contact (e.g., in close contact) with the protective film 7 in a region between the alloy layer 9 and the edge 602 on the connection electrode 5 side in a plan view in the thickness direction D1. Therefore, even when moisture passes through a gap between the alloy layer 9 and the protective film 7, the moisture is unlikely to reach the connection electrode 5, so that the moisture is unlikely to reach the functional element portions 2. Therefore, in the electronic component 100*i* according to preferred embodiment 7, the moisture resistance can be improved, and the reliability can be improved.

In the electronic component 100*i* according to preferred embodiment 7, as in the electronic component 100 according to preferred embodiment 1, the cover portion 4 preferably includes a cover layer 42 and a spacer layer 41 and may further include one or a plurality of intermediate support layers (second spacer layers) disposed inward of the spacer layer 41 (first spacer layer) and located between the cover layer 42 and the substrate 1. In this case, the plurality of connection electrodes 5 passing through the cover portion 4 may include a through electrode passing through the cover layer 42 and the spacer layer 41 and a through electrode passing through the cover layer 42 and the second spacer layers.

The arrangement of the plurality of connection electrodes 5 in the electronic component 100*i* according to preferred embodiment 7 is applicable to modifications 1 and 2 of preferred embodiment 1 and preferred embodiments 2 and 3.

Preferred Embodiment 8

Figure 16:
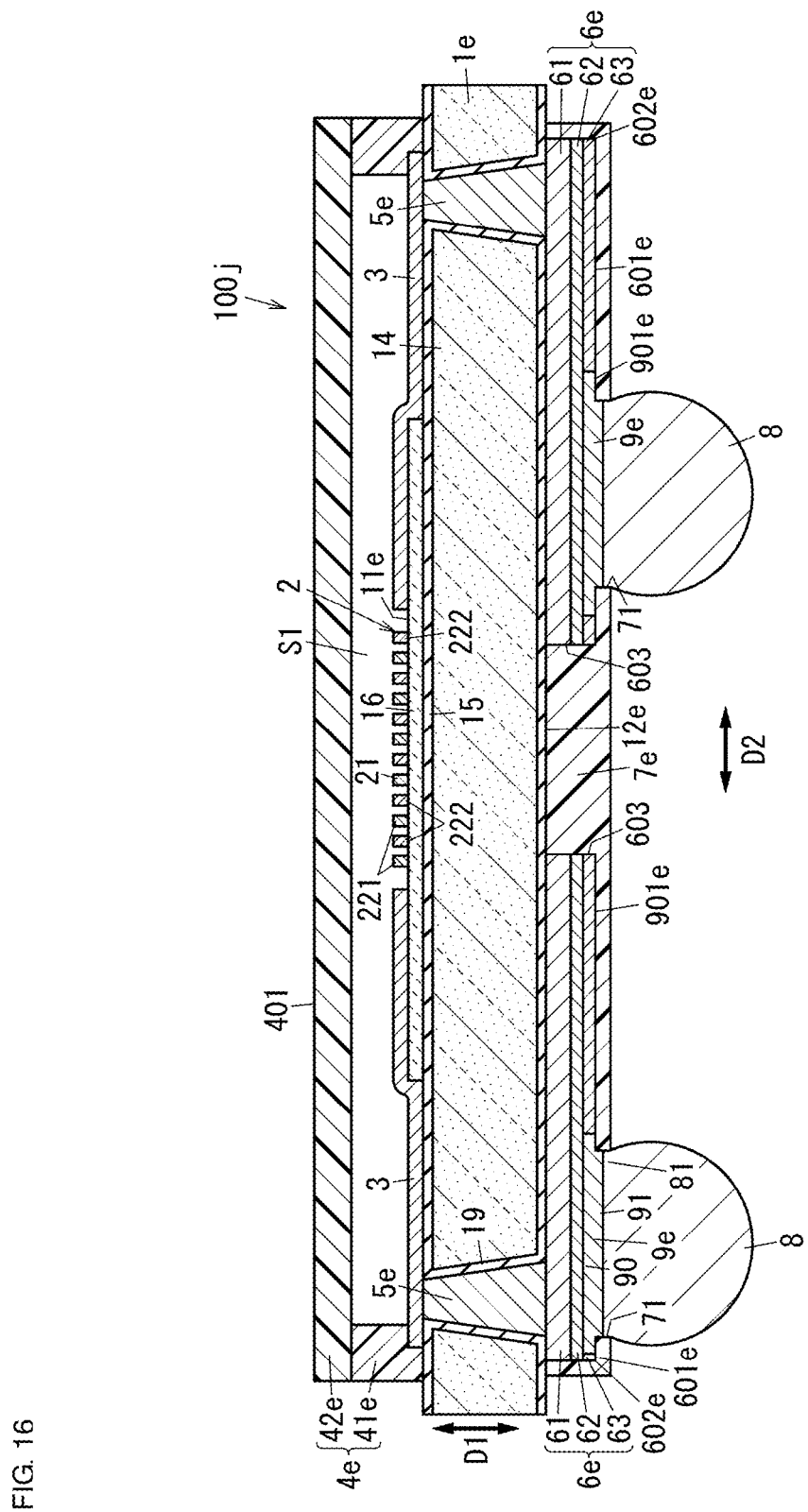
FIG. 16 is a cross-sectional view of an electronic component according to preferred embodiment 8 of the present invention.

An electronic component 100*j* according to preferred embodiment 8 of the present invention will be described referring to FIG. 16.

In the electronic component 100*j* according to preferred embodiment 8, one of the plurality of (four, for example) connection electrodes 5 of the electronic component 100*e* (see FIG. 11) according to preferred embodiment 4 (i.e., the left connection electrode 5*e* in FIG. 16) is preferably structured to entirely or substantially entirely overlap one of the solder bumps 8 in a plan view in the thickness direction D1 of the substrate 1*e*. In the electronic component 100*j* according to preferred embodiment 8, the same elements and portions as those in the electronic component 100*e* according to preferred embodiment 4 are denoted by the same symbols, and their description will be omitted.

The electronic component 100j according to preferred embodiment 8 preferably includes a plurality of sets of the wiring layer 3, the connection electrode 5e, the electrically conductive layer 6e, the solder bump 8, and the alloy layer 9e, as does the electronic component 100e according to preferred embodiment 4. The protective film 7e includes a plurality of openings 71 corresponding to the plurality of sets. In at least one (preferably, for example, three in this case) of the plurality of (preferably, for example, four in this case) sets, the connection electrode 5e is disposed such that at least a portion thereof does not overlap the solder bump 8 in a plan view in the thickness direction D1. The surface 601e of the electrically conductive layer 6e that is located on the protective film 7e side is in contact with the protective film 7e in a region between the alloy layer 9e and the edge 602e on the connection electrode 5e side in a plan view in the thickness direction D1. In the electronic component 100j according to preferred embodiment 8, in the rest of the plurality of sets different from the at least one set (the remaining one set in this case), the connection electrode 5e is structured to entirely or substantially entirely overlap one of the solder bumps 8 in a plan view in the thickness direction D1.

In each of the plurality of sets in the electronic component 100j according to preferred embodiment 8, as in the electronic component 100e according to preferred embodiment 4, the surface 601e of the electrically conductive layer 6e that is located on the protective film 7e side is in contact (close contact) with the protective film 7e in a region between the alloy layer 9e and the edge 602e on the connection electrode 5e side in a plan view in the thickness direction D1, so that the moisture resistance can be improved.

The arrangement of the plurality of connection electrodes 5e in the electronic component 100j according to preferred embodiment 8 is applicable to modifications 1 and 2 of preferred embodiment 1 and preferred embodiments 4 and 5.

Preferred embodiments 1 to 8 described above are merely examples of various preferred embodiments of the present invention. Various modifications can be made to the design etc. of preferred embodiments 1 to 8 as long as the advantageous effects of the present invention can be achieved.

It is only necessary that the electronic components 100, 100a, 100b, 100c, 100d, 100h, and 100i have piezoelectricity in at least regions in which the IDT electrodes 21 are provided. The electronic components 100, 100a, 100b, 100c, 100d, 100h, and 100i are not limited to the piezoelectric substrates and may each be a laminated substrate if so desired.

The laminated substrate preferably includes, for example, a high-acoustic velocity support substrate, a low-acoustic velocity film, and a piezoelectric thin film. The high-acoustic velocity support substrate supports a multilayer body including the low-acoustic velocity film and the piezoelectric thin film. The acoustic velocity of bulk waves propagating through the high-acoustic velocity support substrate is higher than the acoustic velocity of acoustic waves propagating through the piezoelectric thin film. The low-acoustic velocity film is provided directly or indirectly on the high-acoustic velocity support substrate. The acoustic velocity of bulk waves propagating through the low-acoustic velocity film is lower than the acoustic velocity of bulk waves propagating through the piezoelectric thin film. The piezoelectric thin film is disposed directly or indirectly on the low-acoustic velocity film. The piezoelectric thin film is preferably made of, for example, $LiTaO_3$ (lithium tantalate), $LiNbO_3$ (lithium niobate), ZnO (zinc oxide), AlN (aluminum nitride), or PZT (lead zirconate titanate). The high-acoustic velocity support substrate preferably includes, for example, at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond. The low-acoustic velocity film preferably includes, for example, at least one material selected from the group consisting of silicon oxide, glass, silicon oxynitride, tantalum oxide, and a compound obtained by adding fluorine or boron to silicon oxide.

The laminated substrate is not limited to the structure including the high-acoustic velocity support substrate, the low-acoustic velocity film, and the piezoelectric thin film. For example, the laminated substrate may be a substrate including a support substrate, a high-acoustic velocity film, a low-acoustic velocity film, and a piezoelectric thin film.

The support substrate preferably includes, for example, at least one material selected from the group consisting of sapphire, piezoelectric materials such as lithium tantalate, lithium niobate, and quartz, ceramics such as alumina, magnesia, silicon nitride, aluminum nitride, silicon carbide, zirconia, cordierite, mullite, steatite, and forsterite, glass, silicon, gallium nitride, and resins.

The high-acoustic velocity film preferably includes, for example, one material selected from the group consisting of diamond-like carbon, aluminum nitride, aluminum oxide, silicon carbide, silicon nitride, silicon, sapphire, piezoelectric materials such as lithium tantalate, lithium niobate, and quartz, ceramics such as alumina, zirconia, cordierite, mullite, steatite, and forsterite, magnesia, and diamond.

The high-acoustic velocity film functions such that acoustic waves are confined in a portion in which the piezoelectric thin film and the low-acoustic velocity film are laminated and are prevented from leaking to the structure below the high-acoustic velocity film. In a structure including the laminated substrate including the high-acoustic velocity film, the energy of acoustic waves in specific modes used to obtain filter or resonator characteristics is distributed over the entire or substantially the entire piezoelectric thin film and the entire or substantially the entire low-acoustic velocity film and also distributed on part of the high-acoustic velocity film that is located on the low-acoustic velocity film side, but is not distributed in the support substrate.

When the substrate 1 is the laminated substrate, it is preferable that a functional film including the piezoelectric thin film laminated directly or indirectly to the high-acoustic velocity support substrate or the support substrate is spaced apart from the outer circumference of the surface of the high-acoustic velocity support substrate or the support substrate in a plan view in the thickness direction D1 of the substrate 1. When the substrate 1 is the laminated substrate, the electronic component may include an electrically insulating layer that is provided on the surface of the high-acoustic velocity support substrate or the support substrate and surrounds the functional film. In this case, the second connection portions 32 of the wiring layers 3 may be provided on the electrically insulating layer. The material of the electrically insulating layer is preferably, for example, a synthetic resin such as an epoxy resin or a polyimide resin.

The substrate 1 may include, instead of the low-acoustic velocity film, an acoustic impedance layer between the piezoelectric thin film and the support substrate. The acoustic impedance layer has the function of preventing acoustic waves excited by the IDT electrodes 21 from leaking to the support substrate. The acoustic impedance layer preferably includes a multilayer structure in which at least one high-acoustic impedance layer having a relatively high acoustic impedance and at least one low-acoustic impedance layer having a relatively low acoustic impedance are arranged in the thickness direction of the support substrate. In the above multilayer structure, a plurality of the high-acoustic impedance layers may be provided, and a plurality of the low-acoustic impedance layers may be provided. In this case, the multilayer structure is a structure in which the plurality of high-acoustic impedance layers and the plurality of low-acoustic impedance layers are arranged alternately in the thickness direction of the support substrate.

Each high-acoustic impedance layer is preferably made of, for example, platinum, tungsten, aluminum nitride, lithium tantalate, sapphire, lithium niobate, silicon nitride, or zinc oxide.

Each low-acoustic impedance layer is preferably made of, for example, silicon oxide, aluminum, or titanium.

In the electronic component 100, for example, a plurality of surface acoustic wave resonators each including a plurality of IDT electrodes 21 may be electrically connected to each other to define a bandpass filter. The number of wiring layers 3, the number of connection electrodes 5, the number of electrically conductive layers 6, the number of alloy layers 9, and the number of solder bumps 8 are not limited to 4 and may be or a plural number other than 4. These numbers are also applicable to the electronic components 100*a*, 100*b*, 100*c*, 100*d*, 100*e*, 100*f*, 100*g*, 100*h*, 100*i*, and 100*j*.

The material of the spacer layer 41, the material of the cover layer 42, and the material of the protective film 7 in the electronic components 100, 100*a*, 100*b*, 100*c*, and 100*i* are not limited to organic materials, such as synthetic resins, and may be inorganic materials.

Each of the electronic components 100, 100*a*, 100*b*, 100*c*, 100*d*, and 100*i* may include a protective insulating layer that covers the functional element portions 2 and a portion of the second connection portions 32 of the wiring layers 3 on the front surface 11 side of the substrate 1. The material of the protective insulating layer is preferably, for example, silicon oxide, silicon nitride, diamond-like carbon, etc. The thickness of the protective insulating layer is preferably, for example, several tens of nanometers.

The electrically conductive layers 6 and 6*a* may each include a Pd layer interposed between the second layer (Ni layer) 62 and the third layer (Au layer) 63. The first layer 61 is not limited to the Cu layer and may be a Cr layer.

In the electrically conductive layers 6 and 6*b*, for example, the intermediate portion 66 may include a spiral or meandering inductor.

The electronic component is not limited to the acoustic wave device and may be, for example, a semiconductor device. In the electronic component, when each functional element portion does not include the IDT electrode but is a semiconductor element, the cover portion does not necessarily have the structure including the spacer layer and the cover layer and may have a single layer structure. The cover portion may be a multilayer body having three or more layers. In this case, the cover portion may be in contact with the semiconductor element. The semiconductor element is preferably, for example, a transistor, a diode, a capacitor, etc.

(Summary)

In accordance with the above-described preferred embodiments 1 to 8 etc., the following aspects are disclosed.

An electronic component (100; 100*a*; 100*b*; 100*c*; 100*d*; 100*i*) according to a preferred embodiment includes a substrate (1); a functional element portion (2), a wiring layer (3), a cover portion (4; 4*a*; 4*d*), a connection electrode (5; 5*a*; 5*d*), an electrically conductive layer (6; 6*a*; 6*b*; 6*c*; 6*d*), a protective film (7; 7*d*), a solder bump (8), and an alloy layer (9; 9*a*; 9*b*; 9*c*; 9*d*). The functional element portion (2) is on a front surface (11) side of the substrate (1). The wiring layer (3) is on the front surface (11) side of the substrate (1) and is electrically connected to the functional element portion (2). The cover portion (4; 4*a*; 4*d*) is on the front surface (11) side of the substrate (1) and protects the functional element portion (2). The connection electrode (5; 5*a*; 5*d*) is on the wiring layer (3) and extends in a thickness direction (D1) of the substrate (1). The electrically conductive layer (6; 6*a*; 6*b*; 6*c*; 6*d*) is on the cover portion (4; 4*a*; 4*d*) and the connection electrode (5; 5*a*; 5*d*) and electrically connected to the wiring layer (3) via the connection electrode (5; 5*a*; 5*d*). The protective film (7; 7*d*) covers the cover portion (4; 4*a*; 4*d*) and the electrically conductive layer (6; 6*a*; 6*b*; 6*c*; 6*d*) and has an opening (71) in a projection region of part of the electrically conductive layer (6; 6*a*; 6*b*; 6*c*; 6*d*) in the thickness direction (D1). The solder bump (8) is electrically connected to the electrically conductive layer (6; 6*a*; 6*b*; 6*c*; 6*d*) via the opening (71). The alloy layer (9; 9*a*; 9*b*; 9*c*; 9*d*) is formed between the solder bump (8) and the electrically conductive layer (6; 6*a*; 6*b*; 6*c*; 6*d*) in the thickness direction (D1) to join the solder bump (8) to the electrically conductive layer (6; 6*a*; 6*b*; 6*c*; 6*d*) and differs in at least one of composition and a combination of elements from the solder bump (8). The electronic component (100; 100*a*; 100*b*; 100*c*; 100*d*; 100*i*) includes a plurality of sets of the wiring layer (3), the connection electrode (5; 5*a*; 5*d*), the electrically conductive layer (6; 6*a*; 6*b*; 6*c*; 6*d*), the solder bump (8), and the alloy layer (9; 9*a*; 9*b*; 9*c*; 9*d*). The protective film (7; 7*d*) has a plurality of the openings (71) corresponding to the plurality of sets. In at least one set of the plurality of sets, the connection electrode (5; 5*a*; 5*d*) is disposed such that at least a portion thereof does not overlap the solder bump (8) in a plan view in the thickness direction (D1). The electrically conductive layer (6; 6*a*; 6*b*; 6*c*; 6*d*) is in contact with the protective film (7; 7*d*) in a region between the alloy layer (9; 9*a*; 9*b*; 9*c*; 9*d*) and an edge (602; 602*a*; 602*b*; 602*c*; 602*d*) of the electrically conductive layer (6; 6*a*; 6*b*; 6*c*; 6*d*) that is located on a connection electrode (5; 5*a*; 5*d*) side in a plan view in the thickness direction (D1).

In the above-described electronic component (100; 100*a*; 100*b*; 100*c*; 100*d*; 100*i*), the moisture resistance can be improved.

In an electronic component (100; 100*a*; 100*b*; 100*c*; 100*d*; 100*i*) according to a preferred embodiment, in a set different from the at least one set of the plurality of sets, the connection electrode (5) is disposed so as to entirely or substantially entirely overlap the solder bump (8) in a plan view in the thickness direction (D1).

In an electronic component (100; 100*a*; 100*b*; 100*c*; 100*d*; 100*i*) according to a preferred embodiment, in the at least one set, the connection electrode (5; 5*d*) is spaced apart from the solder bump (8) in a plan view in the thickness direction (D1).

In an electronic component (100; 100*a*; 100*b*; 100*c*; 100*d*; 100*i*) according to a preferred embodiment, in the connection electrode (5; 5*d*) in each of the plurality of sets, the distance from the solder bump (8) to the connection electrode (5; 5*d*) is longer than that when the connection electrode (5; 5*d*) has a portion overlapping the solder bump (8) in a plan view in the thickness direction (D1). Therefore, moisture from the outside is unlikely to reach the connection electrode (5; 5*d*), so that the moisture resistance can be improved.

In an electronic component (100; 100*a*; 100*b*; 100*c*; 100*d*; 100*i*) according to a preferred embodiment, in each of the plurality of sets, the electrically conductive layer (6; 6*a*; 6*b*; 6*c*; 6*d*) surrounds the entire or substantially the entire circumference of the alloy layer (9; 9*a*; 9*b*; 9*c*; 9*d*).

In the above-described electronic component (100; 100*a*; 100*b*; 100*c*; 100*d*; 100*i*), the moisture resistance can be further improved as compared with the case where the electrically conductive layer (6; 6*a*; 6*b*; 6*c*; 6*d*) in each of the plurality of sets does not surround the entire circumference of the alloy layer (9; 9*a*; 9*b*; 9*c*; 9*d*).

In an electronic component (100; 100*a*; 100*b*; 100*c*; 100*d*; 100*i*) according to a preferred embodiment, in each of the plurality of sets, at least a portion of the alloy layer (9; 9*a*; 9*b*; 9*c*; 9*d*) is interposed between the protective film (7; 7*d*) and the electrically conductive layer (6; 6*a*; 6*b*; 6*c*; 6*d*) in the thickness direction (D1).

In the above-described electronic component (100; 100*a*; 100*b*; 100*c*; 100*d*; 100*i*), the joint strength between the solder bump (8) and the electrically conductive layer (6; 6*a*; 6*b*; 6*c*; 6*d*) can be improved as compared with the case where at least a portion of the alloy layer (9; 9*a*; 9*b*; 9*c*; 9*d*) in each of the plurality of sets is not interposed between the protective film (7; 7*d*) and the electrically conductive layer (6; 6*a*; 6*b*; 6*c*; 6*d*) in the thickness direction (D1) of the substrate (1).

In an electronic component (100; 100*a*; 100*b*; 100*c*; 100*d*; 100*i*) according to a preferred embodiment, in the at least one set, the length (L6) of a portion of the electrically conductive layer (6; 6*a*; 6*b*; 6*c*; 6*d*) that overlaps the protective film (7; 7*d*) in a region between the alloy layer (9; 9*a*; 9*b*; 9*c*; 9*d*) and the edge (602; 602*a*; 602*b*; 602*c*; 602*d*) of the electrically conductive layer (6; 6*a*; 6*b*; 6*c*; 6*d*) that is located on the connection electrode (5; 5*a*; 5*d*) side in a plan view in the thickness direction (D1) is larger than the length (L9) of a portion of the alloy layer (9; 9*a*; 9*b*; 9*c*; 9*d*) that overlaps the protective film (7; 7*d*).

In the above-described electronic component (100; 100*a*; 100*b*; 100*c*; 100*d*; 100*i*), the moisture resistance can be further improved.

In an electronic component (100; 100*a*; 100*b*; 100*d*; 100*i*) according to a preferred embodiment, in each of the plurality of sets, the electrically conductive layer (6; 6*a*; 6*b*; 6*d*) includes a Au layer (the third layer 63) overlapping the protective film (7) in a plan view in the thickness direction (D1). The Au layer (the third layer 63) is connected to the alloy layer (9; 9*a*; 9*b*; 9*d*). The alloy layer (9; 9*a*; 9*b*; 9*d*) includes Au.

In the above-described electronic component (100; 100*a*; 100*b*; 100*d*; 100*i*), the weather resistance of the electrically conductive layer (6; 6*a*; 6*b*; 6*d*) and the alloy layer (9; 9*a*; 9*b*; 9*d*) in each of the plurality of sets can be improved.

In an electronic component (100*b*) according to a preferred embodiment, in each of the plurality of sets, the electrically conductive layer (6*b*) includes a close contact layer (64). The close contact layer (64) is interposed between the Au layer (the third layer 63) and the protective film (7). The close contact layer (64) has higher adhesion to the protective film (7) than the Au layer (the third layer 63).

In the above-described electronic component (100*b*), the electrically conductive layer (6*b*) in each of the plurality of sets includes the close contact layer (64). Therefore, the adhesion between the protective film (7) and the surface (601*b*) of the electrically conductive layer (6*b*) that is located on the protective film (7) side in the thickness direction (D1) of the substrate (1) can be improved, so that the moisture resistance can be further improved.

In an electronic component (100*b*) according to a preferred embodiment, the protective film (7) includes one material selected from the group consisting of an epoxy resin, a polyimide resin, and an acrylic resin. The close contact layer (64) includes one material selected from the group consisting of Ti, Cr, and NiCr.

In the above-described electronic component (100*b*), the close contact layer (64) can be formed by, for example, sputtering or vapor deposition.

In an electronic component (100*c*) according to a preferred of the present invention, in each of the plurality of sets, the conductive layer (6*c*) includes Cu.

In the above-described electronic component (100*c*) according to the tenth aspect, it is possible to reduce the resistance of the conductive layer (6*c*).

In an electronic component (100; 100*a*; 100*b*; 100*c*; 100*d*; 100*i*) according to a preferred embodiment, in the at least one set, the maximum height roughness of a surface (601; 601*a*; 601*b*; 601*c*) of the electrically conductive layer (6; 6*a*; 6*b*; 6*c*; 6*d*) that is located on a protective film (7; 7*d*) side is larger than the maximum height roughness of a surface (901; 901*a*; 901*b*; 901*c*; 901*d*) of the alloy layer (9; 9*a*; 9*b*; 9*c*; 9*d*) that is located on the protective film (7; 7*d*) side.

In the above-described electronic component according to the eleventh aspect (100; 100*a*; 100*b*; 100*c*; 100*d*; 100*i*), the moisture resistance can be improved as compared with the case where the maximum height roughness of the surface (601; 601*a*; 601*b*; 601*c*; 601*d*) of the electrically conductive layer (6; 6*a*; 6*b*; 6*c*; 6*d*) that is located on the protective film (7; 7*d*) side is equal to or lower than the maximum height roughness of the surface (901; 901*a*; 901*b*; 901*c*; 901*d*) of the alloy layer (9; 9*a*; 9*b*; 9*c*; 9*d*) that is located on the protective film (7; 7*d*) side.

In an electronic component (100; 100*a*; 100*b*; 100*c*; 100*d*; 100*i*) according to a preferred embodiment, in the at least one set, the maximum height roughness of the surface (601; 601*a*; 601*b*; 601*c*; 601*d*) of the electrically conductive layer (6; 6*a*; 6*b*; 6*c*; 6*d*) that is located on the protective film (7; 7*d*) side is 1 μm or more.

In the above-described electronic component (100; 100*a*; 100*b*; 100*c*; 100*d*; 100*i*), the moisture resistance can be improved as compared with the case where the maximum height roughness of the surface (601; 601*a*; 601*b*; 601*c*; 601*d*) of the electrically conductive layer (6; 6*a*; 6*b*; 6*c*; 6*d*) that is located on the protective film (7; 7*d*) side is less than 1 μm.

In an electronic component (100; 100*a*; 100*b*; 100*c*; 100*d*; 100*i*) according to a preferred embodiment, in each of the plurality of sets, the solder bump (8) overlaps the entire or substantially the entire opening (71) in a plan view in the thickness direction (D1).

In the above-described electronic component (100; 100*a*; 100*b*; 100*c*; 100*d*; 100*i*), in the each of the plurality of sets, the joint strength between the solder bump (8) and the electrically conductive layer (6; 6*a*; 6*b*; 6*c*; 6*d*) can be improved.

In an electronic component (100; 100*a*; 100*b*; 100*c*; 100*i*) according to a preferred embodiment, in each of the plurality of sets, the connection electrode (5; 5*a*) is a through electrode passing through the cover portion (4) in the thickness direction (D1) of the substrate (1).

The above-described electronic component (100; 100*a*; 100*b*; 100*c*; 100*i*) can be reduced in size.

In an electronic component (100; 100a; 100b; 100c; 100i) according to a preferred embodiment, the functional element portion (2) includes an IDT electrode (21). The substrate (1) has piezoelectricity at least in a region in which the IDT electrode (21) is disposed. The cover portion (4; 4a) includes a cover layer (42; 42a) and a spacer layer (41; 41a). The cover layer (42; 42a) faces the substrate (1) in the thickness direction (D1) and is spaced apart from the functional element portion (2). The spacer layer (41; 41a) has a frame shape. The spacer layer (41; 41a) is interposed between the substrate (1) and the cover layer (42; 42a) and surrounds the functional element portion (2) in a plan view in the thickness direction (D1). In each of the plurality of sets, the connection electrode (5; 5a) passes through the spacer layer (41; 41a) and the cover layer (42; 42a) in the thickness direction (D1).

In the above-described electronic component (100; 100a; 100b; 100c; 100i), moisture from the outside can be prevented from reaching the IDT electrode (21), and the moisture resistance can be improved.

In an electronic component (100d) according to a preferred embodiment, in each of the plurality of sets, the connection electrode (5d) extends along an outer circumferential surface (403) of the cover portion (4d) to the wiring layer (3) and is connected to the wiring layer (3). The protective film (7d) covers the wiring layer (3).

In the above-described electronic component (100d), the flexibility in selection of the material of the substrate (1) is higher than that when a through electrode is formed in the substrate (1).

In an electronic component (100; 100a; 100b; 100c; 100i) according to a preferred embodiment, the substrate (1) is a piezoelectric substrate.

An electronic component (100e; 100f; 100g; 100h; 100j) according to a preferred embodiment includes a substrate (1e; 1); a functional element portion (2); a wiring layer (3); a cover portion (4e; 4g; 4h); a connection electrode (5e; 5g); an electrically conductive layer (6e; 6f; 6g; 6h); a protective film (7e; 7f; 7g; 7h); a solder bump (8); and an alloy layer (9e; 9f; 9g; 9h). The functional element portion (2) is on a front surface (11e; 11) side of the substrate (1e; 1). The wiring layer (3) is on the front surface (11e; 11) side of the substrate (1e; 1) and electrically connected to the functional element portion (2). The cover portion (4e; 4g; 4h) is on the front surface (11e; 11) side of the substrate (1e; 1) and protects the functional element portion (2). The connection electrode (5e; 5g; 5h) is on the wiring layer (3) and extends in the thickness direction (D1) of the substrate (1e; 1). The electrically conductive layer (6e; 6f; 6g; 6h) is on a back surface (12e; 12f; 12g; 12h) of the substrate (le; 1) that is opposite to the front surface (11e; 11) and on the connection electrode (5e; 5g; 5h) and electrically connected to the wiring layer (3) via the connection electrode (5e; 5g; 5h). The protective film (7e; 7f; 7g; 7h) covers the back surface (12e; 12) of the substrate (1e; 1) and the electrically conductive layer (6e; 6f; 6g; 6h) and has an opening (71) in a projection region of part of the electrically conductive layer (6e; 6f; 6g; 6h) in the thickness direction (D1). The solder bump (8) is electrically connected to the electrically conductive layer (6e; 6f; 6g; 6h) via the opening (71). The alloy layer (9e; 9f) is formed between the solder bump (8) and the electrically conductive layer (6e; 6f; 6g; 6h) in the thickness direction (D1) to join the solder bump (8) to the electrically conductive layer (6e; 6f; 6g; 6h). The alloy layer (9e; 9f) differs in at least one of composition and a combination of elements from the solder bump (8). The electronic component (100e; 100f; 100g; 100h; 100j) includes a plurality of sets of the wiring layer (3), the connection electrode (5e; 5g; 5h), the electrically conductive layer (6e; 6f; 6g; 6h), the solder bump (8), and the alloy layer (9e; 9f; 9g; 9h). The protective film (7e; 7f; 7g; 7h) has a plurality of the openings (71) corresponding to the plurality of sets. In at least one set of the plurality of sets, the connection electrode (5e; 5g; 5h) is disposed such that at least a portion thereof does not overlap the solder bump (8) in a plan view in the thickness direction (D1). A surface (601e; 601f; 601g; 601h) of the electrically conductive layer (6e; 6f; 6g; 6h) that is located on a protective film (7e; 7f; 7g; 7h) side is in contact with the protective film (7e; 7f; 7g; 7h) in a region between the alloy layer (9e; 9f; 9g; 9h) and an edge (602e; 602f; 602g; 602h) of the electrically conductive layer (6e; 6f; 6g; 6h) that is located on a connection electrode (5e; 5g; 5h) side in a plan view in the thickness direction (D1).

In the above-described electronic component (100e; 100f; 100g; 100h; 100j), the moisture resistance can be improved.

In an electronic component (100e; 100f; 100g; 100h; 100j) according to a preferred embodiment, in a set of the plurality of sets that differs from the at least one set, the connection electrode (5) is disposed so as to entirely or substantially entirely overlap the solder bump (8) in a plan view in the thickness direction (D1).

In an electronic component (100e; 100f; 100g; 100h; 100j) according to a preferred embodiment, in the at least one set, the connection electrode (5e; 5g; 5h) is spaced apart from the solder bump (8) in a plan view in the thickness direction (D1).

In the above-described electronic component (100e; 100f; 100g; 100h; 100j), in the connection electrode (5e; 5g; 5h) in the at least one set, the distance from the solder bump (8) to the connection electrode (5e; 5g; 5h) is larger than that when the connection electrode (5e; 5g; 5h) includes a portion overlapping the solder bump (8) in a plan view in the thickness direction (D1). Therefore, moisture from the outside is unlikely to reach the connection electrode (5e; 5g; 5h), and the moisture resistance can be improved.

In an electronic component (100e; 100f; 100g; 100h; 100j) according to a preferred embodiment, in each of the plurality of sets, the electrically conductive layer (6e; 6f; 6g; 6h) surrounds the entire or substantially the entire circumference of the alloy layer (9e; 9f; 9g; 9h).

In the above-described electronic component (100e; 100f; 100g; 100h; 100j), the moisture resistance can be further improved as compared with the case where, in each of the plurality of sets, the electrically conductive layer (6e; 6f; 6g; 6h) does not surround the entire or substantially the entire circumference of the alloy layer (9e; 9f; 9h; 9g).

In an electronic component (100e; 100f; 100g; 100h; 100j) according to a preferred embodiment, in each of the plurality of sets, at least a portion of the alloy layer (9e; 9f; 9g; 9h) is interposed between the protective film (7e; 7f; 7g; 7h) and the electrically conductive layer (6e; 6f; 6g; 6h) in the thickness direction (D1).

In the above-described electronic component (100e; 100f; 100g; 100h; 100j), the joint strength between the solder bump (8) and the electrically conductive layer (6e; 6f; 6g; 6h) can be improved as compared with the case where, in each of the plurality of sets, at least a portion of the alloy layer (9e; 9f; 9g; 9e) is not interposed between the protective film (7e; 7f; 7g; 7h) and the electrically conductive layer (6e; 6f; 6g; 6h) in the thickness direction (D1) of the substrate (1e; 1).

In an electronic component (100e; 100f; 100g; 100h; 100j) according to a preferred embodiment, in the at least one set, the length (L6) of a portion of the electrically conductive layer (6e; 6f; 6g; 6h) that overlaps the protective film (7e; 7f; 7g; 7h) in the region between the alloy layer (9e; 9f; 9g; 9h) and the edge (602e; 602f; 602g; 602h) of the electrically conductive layer (6e; 6f; 6g; 6h) that is located on the connection electrode (5e; 5g; 5h) side in a plan view in the thickness direction (D1) is larger than the length (L9) of a portion of the alloy layer (9e; 9f; 9g; 9h) that overlaps the protective film (7e; 7f; 7g; 7h).

In the above-described electronic component (100e; 100f; 100g; 100h; 100j), the moisture resistance can be further improved.

In an electronic component (100e; 100f; 100h; 100j) according to a preferred embodiment, in each of the plurality of sets, the electrically conductive layer (6e; 6f; 6h) includes a Au layer (third layer 63) overlapping the protective film (7e; 7f; 7h) in a plan view in the thickness direction (D1). The Au layer (third layer 63) is connected to the alloy layer (9e; 9f; 9h). The alloy layer (9e; 9f; 9h) includes Au.

In the above-described electronic component (100e; 100f; 100h; 100j), the weather resistance of the electrically conductive layer (6e; 6f; 6h) and the alloy layer (9e; 9f; 9h) in each of the plurality of sets can be improved.

In an electronic component (100f) according to a preferred embodiment, in each of the plurality of sets, the electrically conductive layer (6f) includes a close contact layer (64). The close contact layer (64) is interposed between the Au layer (third layer 63) and the protective film (7f). The close contact layer (64) has higher adhesion to the protective film (7f) than the Au layer (third layer 63).

In the above-described electronic component (100f), since the electrically conductive layer (6f) in each of the plurality of sets includes the close contact layer (64), the adhesion between the protective film (7f) and the surface (601f) of the electrically conductive layer (6f) that is located on the protective film (7f) side in the thickness direction (D1) of the substrate (1) can be improved, and the therefore moisture resistance can be further improved.

In an electronic component (100f) according to a preferred embodiment, the protective film (7f) includes one material selected from the group consisting of an epoxy resin, a polyimide resin, and an acrylic resin. The close contact layer (64) includes one material selected from the group consisting of Ti, Cr and NiCr.

In the above-described electronic component (100f), the close contact layer (64) can be formed by sputtering, vapor deposition, etc.

In an electronic component (100g) according to a preferred embodiment, in each of the plurality of sets, the electrically conductive layer (6g) includes Cu.

In the above-described electronic component (100g), the resistance of the electrically conductive layer (6g) can be reduced.

In an electronic component (100e; 100f; 100g; 100h; 100j) according to a preferred embodiment, in the at least one set, the maximum height roughness of the surface (601e; 601f; 601g; 601h) of the electrically conductive layer (6e; 6f; 6g; 6h) that is located on the protective film (7e; 7f; 7g; 7h) side is larger than the maximum height roughness of a surface (901e; 901f; 901g; 901h) of the alloy layer (9e; 9f; 9g; 9h) that is located on the protective film (7e; 7f; 7g; 7h) side.

In the above-described electronic component (100e; 100f; 100g; 100h; 100j), the moisture resistance can be improved as compared with the case where the maximum height roughness of the surface (601e; 601f; 601g; 601h) of the electrically conductive layer (6e; 6f; 6g; 6h) that is located on the protective film (7e; 7f; 7g; 7h) side is equal to or lower than the maximum height roughness of the surface (901e; 901f; 901g; 901h) of the alloy layer (9e; 9f; 9g; 9h) that is located on the protective film (7e; 7f; 7g; 7h) side.

In an electronic component (100e; 100f; 100g; 100h; 100j) according to a preferred embodiment, in the at least one set, the maximum height roughness of the surface (601e; 601f; 601g; 601h) of the electrically conductive layer (6e; 6f; 6g; 6h) that is located on the protective film (7e; 7f; 7g; 7h) side is 1 µm or more.

In the above-described electronic component (100e; 100f; 100g; 100h; 100j), the moisture resistance can be improved as compared with the case where the maximum height roughness of the surface (601e; 601f; 601g; 601h) of the electrically conductive layer (6e; 6f; 6g; 6h) that is located on the protective film (7e; 7f; 7g; 7h) side is less than 1 µm.

In an electronic component (100e; 100f; 100g; 100j) according to a preferred embodiment, in each of the plurality of sets, the connection electrode (5e; 5g) is a through electrode passing through the substrate (1e; 1) in the thickness direction (D1) of the substrate (1e; 1).

The above-described electronic component (100e; 100f; 100g; 100j) can be reduced in size.

In an electronic component (100h) according to a preferred embodiment, in each of the plurality of sets, the connection electrode (5h) extends along an outer circumferential surface (13) of the substrate (1) to the front surface (11) of the substrate (1) and is connected to the wiring layer (3).

In the above-described electronic component (100h), the flexibility in selection of the material of the substrate (1) is higher than that when a through electrode is formed in the substrate (1).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate;
   a functional element portion that is on a front surface side of the substrate;
   a wiring layer that is on the front surface side of the substrate and electrically connected to the functional element portion;
   a cover portion that is on the front surface side of the substrate and protects the functional element portion;
   a connection electrode that is on the wiring layer and extends in a thickness direction of the substrate;
   an electrically conductive layer that is on the cover portion and the connection electrode and electrically connected to the wiring layer via the connection electrode;
   a protective film that covers the cover portion and the electrically conductive layer and includes an opening in a projection region of a portion of the electrically conductive layer in the thickness direction;
   a solder bump that is electrically connected to the electrically conductive layer via the opening; and
   an alloy layer that is between the solder bump and the electrically conductive layer in the thickness direction to join the solder bump to the electrically conductive layer and differs in at least one of composition and a combination of elements from the solder bump; wherein the electronic component includes a plurality of sets of the wiring layer, the connection electrode, the electrically conductive layer, the solder bump, and the alloy layer;
the protective film includes a plurality of the openings corresponding to the plurality of sets;
in at least one set of the plurality of sets:
the connection electrode is structured such that at least a portion thereof does not overlap the solder bump in a plan view in the thickness direction; and
a surface of the electrically conductive layer that is located on a protective film side is in contact with the protective film in a region between the alloy layer and an edge of the electrically conductive layer that is located on a connection electrode side in the plan view in the thickness direction; and
in each of the plurality of sets, a portion of the alloy layer is interposed between the protective film and the cover portion in the thickness direction of the substrate.

2. The electronic component according to claim 1, wherein in a set of the plurality of sets that differs from the at least one set, the connection electrode entirely or substantially entirely overlaps the solder bump in the plan view in the thickness direction.

3. The electronic component according to claim 1, wherein in the at least one set, the connection electrode is spaced apart from the solder bump in the plan view in the thickness direction.

4. The electronic component according to claim 1, wherein in each of the plurality of sets, the electrically conductive layer surrounds an entire or substantially an entire circumference of the alloy layer.

5. The electronic component according to claim 1, wherein in each of the plurality of sets, at least a portion of the alloy layer is interposed between the protective film and the electrically conductive layer in the thickness direction.

6. The electronic component according to claim 5, wherein in the at least one set, a length of a portion of the electrically conductive layer that overlaps the protective film in the region between the alloy layer and the edge of the electrically conductive layer that is located on the connection electrode side in the plan view in the thickness direction is larger than a length of a portion of the alloy layer that overlaps the protective film.

7. The electronic component according to claim 1, wherein
in each of the plurality of sets, the electrically conductive layer includes an Au layer overlapping the protective film in the plan view in the thickness direction;
the Au layer is connected to the alloy layer; and
the alloy layer includes Au.

8. The electronic component according to claim 7, wherein in each of the plurality of sets, the electrically conductive layer includes a close contact layer that is interposed between the Au layer and the protective film and has higher adhesion to the protective film than the Au layer.

9. The electronic component according to claim 8, wherein
the protective film includes one material selected from a group consisting of an epoxy resin, a polyimide resin, and an acrylic resin; and
the close contact layer includes one material selected from a group consisting of Ti, Cr, and NiCr.

10. The electronic component according to claim 1, wherein in each of the plurality of sets, the electrically conductive layer includes Cu.

11. The electronic component according to claim 1, wherein in the at least one set, a maximum height roughness of the surface of the electrically conductive layer that is located on the protective film side is larger than a maximum height roughness of a surface of the alloy layer that is located on the protective film side.

12. The electronic component according to claim 11, wherein in the at least one set, the maximum height roughness of the surface of the electrically conductive layer that is located on the protective film side is about 1 μm or more.

13. The electronic component according to claim 1, wherein in each of the plurality of sets, the solder bump overlaps an entirety or substantially an entirety of the opening in the plan view in the thickness direction.

14. The electronic component according to claim 1, wherein in each of the plurality of sets, the connection electrode is a through electrode passing through the cover portion in the thickness direction of the substrate.

15. The electronic component according to claim 14, wherein
the functional element portion includes an Interdigital Transducer (IDT) electrode;
the substrate has piezoelectricity at least in a region in which the IDT electrode is provided;
the cover portion includes:
a cover layer that opposes the substrate in the thickness direction and is spaced apart from the functional element portion; and
a spacer layer that has a frame shape, is interposed between the substrate and the cover layer, and surrounds the functional element portion in a plan view in the thickness direction; and
in each of the plurality of sets, the through electrode passes through the spacer layer and the cover layer in thickness direction.

16. The electronic component according to claim 1, wherein
in each of the plurality of sets, the connection electrode extends along an outer circumferential surface of the cover portion to the wiring layer and is connected to the wiring layer; and
the protective film covers the wiring layer in each of the plurality of sets.

17. The electronic component according to claim 15, wherein
the substrate is a piezoelectric substrate.

* * * * *